United States Patent
Lai et al.

(10) Patent No.: US 9,673,270 B2
(45) Date of Patent: Jun. 6, 2017

(54) METAL INSULATOR METAL CAPACITOR AND METHOD FOR MAKING THE SAME

(71) Applicant: Taiwan Semiconductor Manufacturing Company, Ltd., Hsin-Chu (TW)

(72) Inventors: Yu-Chia Lai, Zhunan Township (TW); Tung-Liang Shao, Hsin-Chu (TW); Ching-Jung Yang, Pingzhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/867,902

(22) Filed: Sep. 28, 2015

(65) Prior Publication Data

US 2016/0020269 A1    Jan. 21, 2016

Related U.S. Application Data

(62) Division of application No. 14/052,409, filed on Oct. 11, 2013, now Pat. No. 9,153,504.

(51) Int. Cl.
| | | |
|---|---|---|
| *H01L 21/02* | (2006.01) | |
| *H01L 27/15* | (2006.01) | |
| *H01L 49/02* | (2006.01) | |
| *H01L 21/66* | (2006.01) | |
| *H01L 21/768* | (2006.01) | |

(52) U.S. Cl.
CPC ............ *H01L 28/60* (2013.01); *H01L 21/768* (2013.01); *H01L 22/14* (2013.01); *H01L 22/32* (2013.01); *H01L 22/34* (2013.01); *H01L 28/40* (2013.01); *H01L 2924/181* (2013.01)

(58) Field of Classification Search
CPC ....... H01L 28/60; H01L 21/768; H01L 22/14; H01L 22/32; H01L 22/34; H01L 28/40; H01L 2924/181
USPC ............... 257/532, 79, 535; 438/17, 18, 396
See application file for complete search history.

(56) References Cited

U.S. PATENT DOCUMENTS

| | | | |
|---|---|---|---|
| 6,475,860 B2 * | 11/2002 | Kwon | H01L 28/55 257/E21.009 |
| 6,504,202 B1 | 1/2003 | Allman et al. | |
| 6,897,503 B2 * | 5/2005 | Otani | H01L 28/55 257/295 |
| 2002/0014644 A1 * | 2/2002 | Van Buskirk | C04B 35/491 257/295 |
| 2002/0127792 A1 | 9/2002 | Yoshitomi et al. | |

(Continued)

*Primary Examiner* — Dzung Tran
(74) *Attorney, Agent, or Firm* — Slater Matsil, LLP

(57) ABSTRACT

A semiconductor device includes one or more metal-insulator-metal (MiM) capacitors. The semiconductor device includes a bottom electrode, a dielectric layer located above, and in physical contact with, the bottom electrode, a top electrode located above, and in physical contact with, the dielectric layer, a first top contact contacting the top electrode, a first bottom contact contacting the bottom electrode from a top electrode direction, a first metal bump connecting to the top contact, and a second metal bump connecting to the bottom contact. The top electrode has a smaller area than the bottom electrode. The bottom electrode, the dielectric layer, and the top electrode is a MiM capacitor. Top electrodes of a number of MiM capacitors and bottom electrodes of a number of MiM capacitors are daisy chained to allow testing of the conductivity of the electrodes.

20 Claims, 18 Drawing Sheets

(56) References Cited

U.S. PATENT DOCUMENTS

| | | | |
|---|---|---|---|
| 2004/0106266 A1 | 6/2004 | Huang et al. | |
| 2004/0130849 A1* | 7/2004 | Kurihara | H01G 4/228 361/311 |
| 2008/0186654 A1 | 8/2008 | Takeshima et al. | |
| 2008/0257487 A1* | 10/2008 | Shioga | H01G 4/232 156/249 |
| 2008/0315358 A1 | 12/2008 | Shioga et al. | |
| 2011/0110016 A1* | 5/2011 | Takeshima | H01G 4/232 361/311 |

* cited by examiner

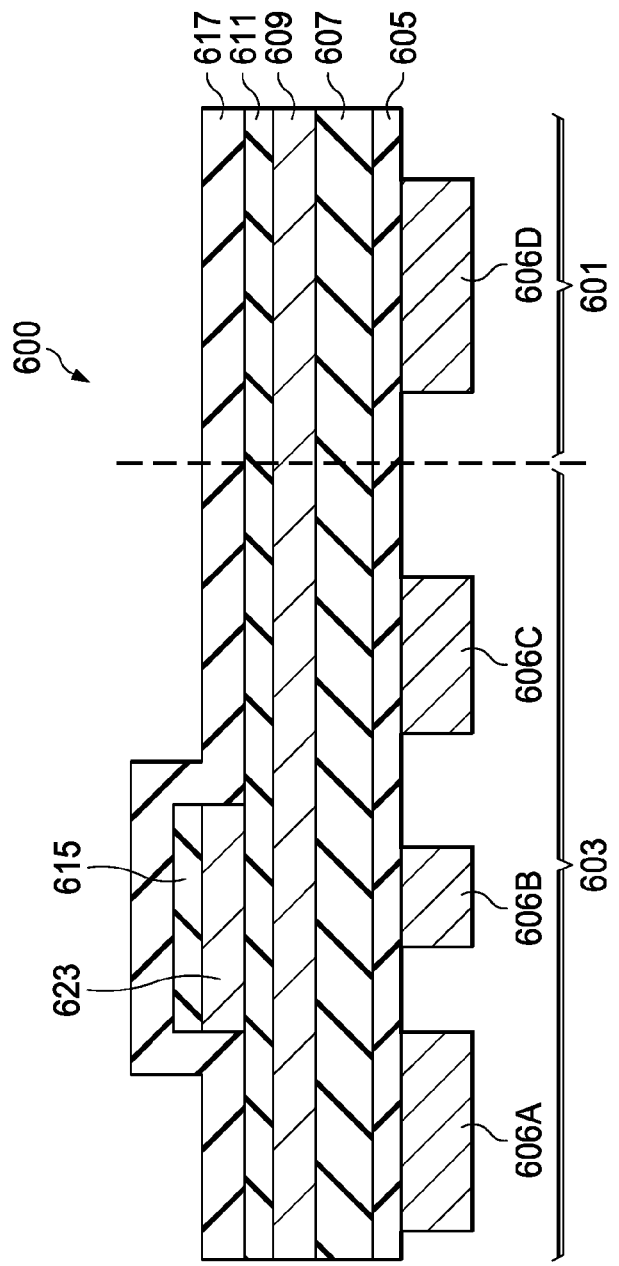

METAL INSULATOR METAL CAPACITOR AND METHOD FOR MAKING THE SAME

This application is divisional application of U.S. patent application Ser. No. 14/052,409, entitled "Metal Insulator Metal Capacitor and Method for Making the Same," filed on Oct. 11, 2013, which applications are incorporated herein by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Metal-insulator-metal (MiM) capacitors are used in many applications on an integrated circuit (IC), including for signal conditioning. During the operation of certain circuits, power supply lines may supply transient currents with a relatively high intensity. These conditions can result in noise on the power supply lines. Specifically, the voltage on the power supply line may fluctuate when the transition time of the transient current is particularly short or when the line's parasitic inductance or parasitic resistance is large. To ameliorate such conditions, filtering or decoupling capacitors may be used, acting as temporary charge reservoirs to prevent momentary fluctuations in supply voltage.

Integrating decoupling capacitors into certain systems-on-chip (SOCs) may entail a number of problems. For example, some decoupling capacitors may suffer from capacitance variations, delamination of conductors from the electrodes, or inadequate electrical coupling between the conductor and the electrodes. These capacitors may be integrated in the multi-level interconnect (MLI) at different levels. Before circuit design and a process for forming a circuit can be qualified for manufacturing, all devices including MiM capacitors should be tested to verify functionality.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIGS. 6A-L are cross-sectional representations of a MiM decoupling capacitor during various steps of fabrication.

Figure 1:
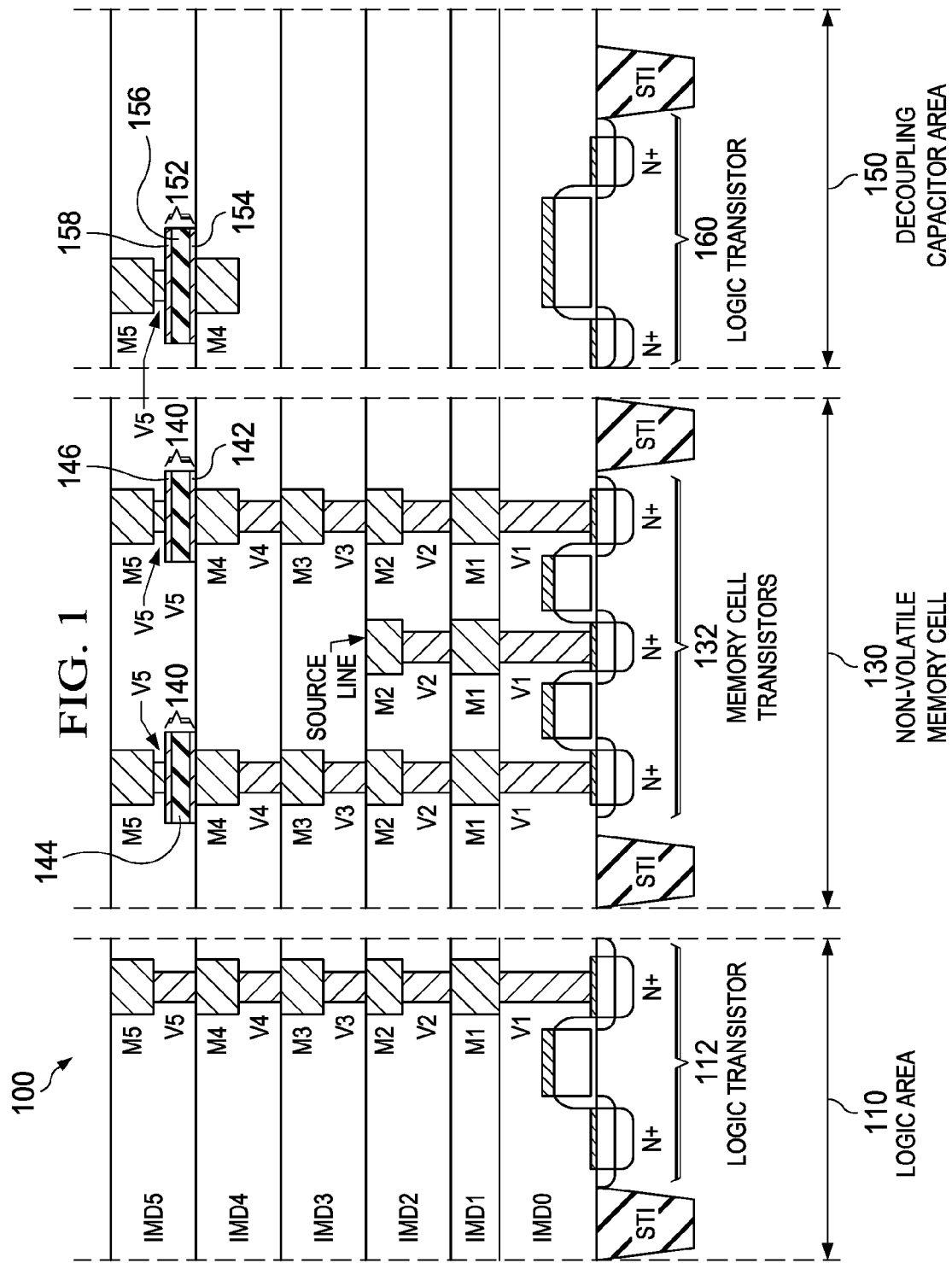
FIG. 1 is a cross-sectional diagram of a system-on-chip (SOC) that includes a metal-insulator-metal (MiM) capacitor.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

FIG. 1 illustrates a system-on-chip (SOC) 100, which may include a plurality of functional areas fabricated on a single substrate. As depicted in FIG. 1, SOC 100 includes a logic area 110, a non-volatile memory (NVM) cell 130, and a decoupling capacitor area 150. Logic area 110 may include circuitry, such as the exemplary transistor 112, for processing information received from non-volatile memory cell 130 and for controlling reading and writing functions of NVM cell 130. In some embodiments, NVM cell 130 may be a resistive random-access memory (RRAM) cell, phase-change random-access memory (PCRAM) cell, magnetoresistive random-access memory (MRAM) cell, or a transistor based random-access memory such as flash memory or static random-access memory (SRAM). An NVM cell may be used to hold a binary piece of data, or a bit. Depending on the type of memory cell, NVM 130 may include a pair of metal-insulator-metal (MiM) structures 140. Each MiM structure 140 may include a bottom electrode 142 and top electrode 146, with a dielectric layer 144 sandwiched in between the two electrodes.

Decoupling capacitor area 150, as depicted, includes a MiM decoupling capacitor 152 may be fabricated simultaneously with MiM structures 140. For example, after M4 has been patterned and IMD4 has been deposited, SOC 100 undergoes a planarization process, such as chemo-mechanical planarization (CMP). After the CMP process, a bottom electrode 154 is deposited overlaying IMD4 and the exposed portions of M4. The bottom electrode 154 may be any of a variety of materials; specifically, bottom electrode materials may include Pt, AlCu, TiN, Au, Ti, Ta, TaN, W, WN, and Cu. Generally, the bottom electrode materials are conductive materials such as metals, certain metal nitrides, and silicided metal nitrides. The dielectric layer 156 is formed from an insulating material, including but not limited to NiO, TiO, HfO, ZrO, ZnO, $WO_3$, $Al_2O_3$, TaO, MoO, and CuO. The insulating material may be a high dielectric constant (high-k) material, which may include $TiO_2$, $Ta_2O_5$, $Y_2O_3$, $La_2O_5$, $HfO_2$, and other materials. The top electrode 158 may be fabricated of any of the same materials as bottom electrode 154, as described above, though the same material is not necessarily used for both the top and bottom electrodes. The substrate surface area of MiM decoupling capacitor area 150 may include SOC logic, including exemplary logic transistor 160. A single mask may be used to form MiM structures 140 and MiM decoupling capacitor 152.

The SOC 100 also includes shallow-trench isolation (STI) features, and pluralities of metallization layers and vias. As depicted, SOC 100 is fabricated using five metallization layers, labeled as M1 through M5, with five layers of metallization vias or interconnects, labeled as V1 through V5. Other embodiments may contain more or fewer metallization layers and a corresponding more or fewer number of vias. Logic area 110 includes a full metallization stack, including a portion of each of metallization layers M1-M5 connected by interconnects V2-V5, with V1 connecting the stack to a source/drain contact of logic transistor 112. NVM cell 130 includes a full metallization stack connecting MiM structures 140 to memory cell transistors 132. MiM structures 140 are depicted as being fabricated in between the top of the M4 layer and the bottom the M5 layer. Also included in SOC 100 is a plurality of inter-metal dielectric (IMD) layers. Six IMD layers, identified as IMD0 through IMD5 are depicted in FIG. 1 as spanning the logic area 110, RRAM cell 130, and decoupling capacitor area 150. The IMD layers may provide electrical insulation as well as structural support for the various features of SOC 100 during many fabrication process steps, some of which will be discussed herein.

The decoupling capacitor 152 may be used by SOC 100 to condition power supply lines that supply current to charge and discharge active and passive devices included in SOC 100. When voltages swing during a clock transition, fluctuations on the power supply lines may introduce noise. Decoupling capacitor 152 acts as a charge reservoir to smooth out a certain amount of the introduced noise.

The MiM capacitors 140 and 152 of FIG. 1 are connected from top to a top electrode and from the bottom from a bottom electrode. Functional testing of the MiM capacitor structure is routed through the entire circuit, for example, the memory cell 130. It is difficult to distinguish issues of the circuit to a specific portion, for example, the MiM capacitor, the transistor, or the intervening interconnect structure. During process and package development, the ability to separately test MiM capacitor structures is beneficial to pinpoint problem areas, for example, delamination of the metal contact to one or more of the MiM capacitor electrodes, the dielectric layer between the electrodes, or short circuits through other features. The present invention pertains to a MiM capacitor structure to be used in a test vehicle to detect and pinpoint failures in the MiM capacitor structure and a process for testing the MiM capacitors.

Figure 2:
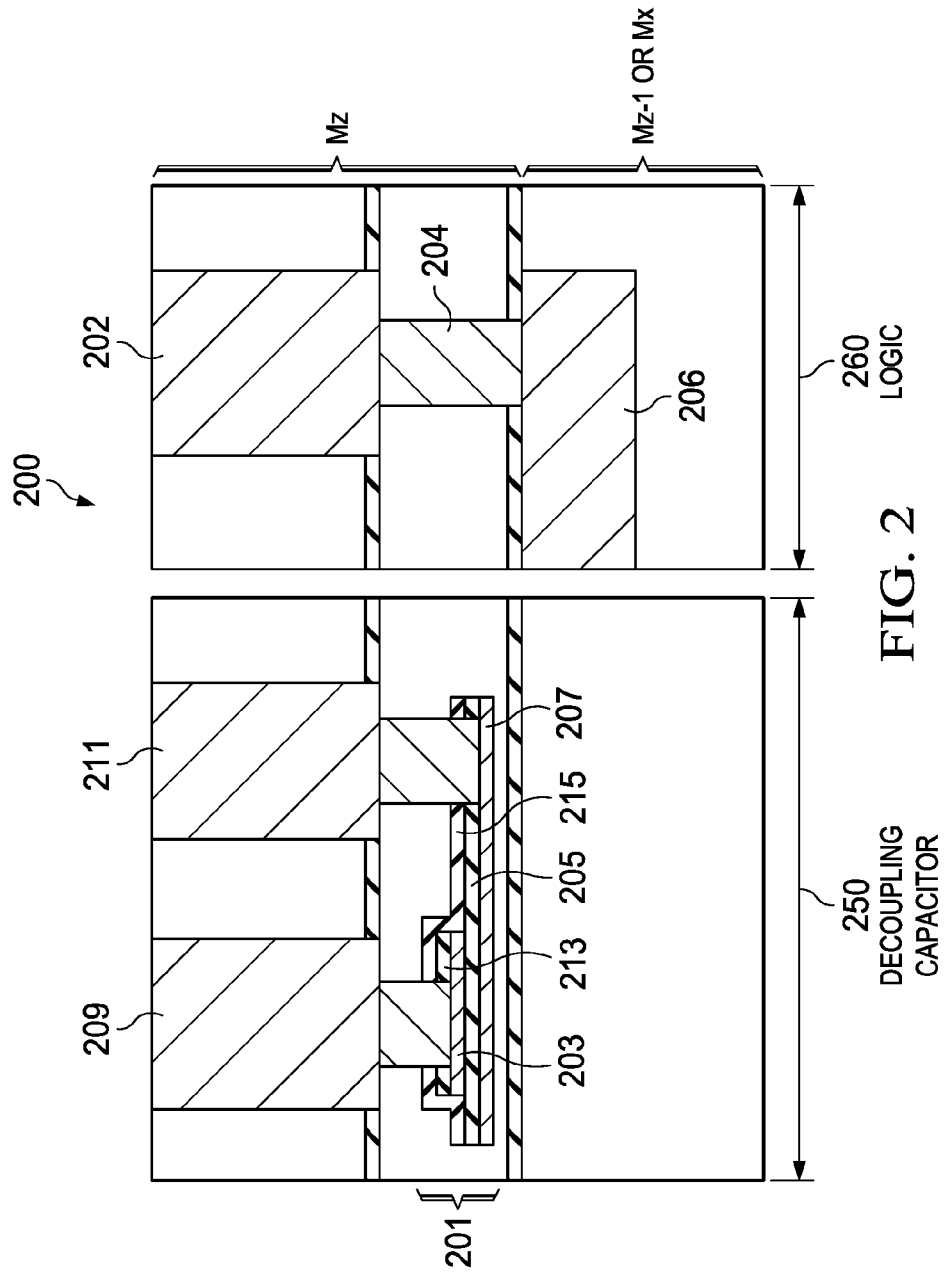
FIG. 2 is a cross-sectional diagram of an SOC that includes a decoupling capacitor areas and a logic area in a metal interconnect layer according to various embodiments of the present disclosure.

FIG. 2 includes a MiM capacitor structure cross-section 201 in a decoupling capacitor area 250 and an interconnect structure in a logic area 260 in an SOC 200 according to various embodiments. The MiM capacitor 201 includes a top electrode 203 over a dielectric layer 205 over a bottom electrode 207. The top electrode 203 has a smaller area than the bottom electrode 207. The top electrode 203 directly contacts a top contact 209. A first passivation layer 213 surrounds an interface between the top contact 209 and the top electrode 203 and may cover the entire top electrode 203. A second passivation layer 215 covers the first passivation layer 213 and portions of the dielectric layer 205 where the top electrode 203 does not cover the dielectric layer 205. A bottom contact 211 contacts the bottom electrode 207 through the dielectric layer 205 from a same direction as the top contact 209. The top contact 209 and the bottom contact 211 are both connected to different conductive bumps (not shown). The conductive bumps may be located directly above the metal layer Mz when the MiM capacitor is located in the top electrode layer or there may be one or more intervening metal layers.

In the logic area 260 of FIG. 2, the metal line 202 and conductive via 204 are located in the same metal layer as the MiM capacitor and the top and bottom contacts. Conductive via 204 is connected to another metal line 206 in the metal layer Mz−1 or Mx immediately below the metal layer Mz.

By connecting to the bottom electrode 207 through the top as opposed to the bottom as shown in FIG. 1, the electrical properties of the bottom electrode 207 and the MiM capacitor 201 can be easily tested. In one example, capacitance is measured across the conductive bumps through the top contact 209 and the bottom contact 211 to verify the MiM capacitor 201 works as intended.

Figure 3:
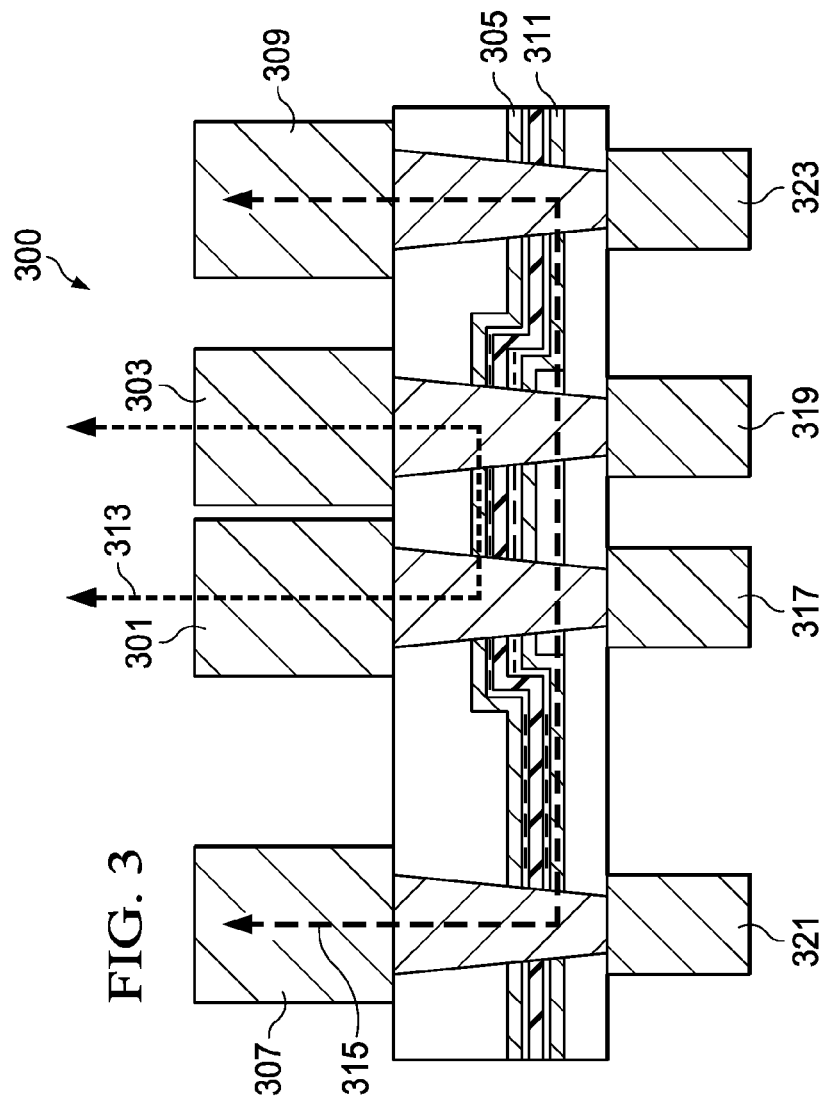
FIG. 3 is a cross-sectional diagram of a metal insulator metal (MiM) capacitor in accordance with various embodiments of the present disclosure.

According to various embodiments, more than one top contact and more than one bottom contact may be used to connect to the top and bottom electrodes. FIG. 3 is a cross sectional diagram of a MiM capacitor 300 having top contacts 301 and 303 connected to the top electrode 305 and bottom contacts 307 and 309 connected to the bottom electrode 311. The bottom contacts 307 and 309 extend through openings in the top electrode 305. The top contacts 301 and 303 extend through openings in the bottom electrode 311 to metal lines 317 and 319. As shown in FIG. 3, the bottom contacts 307 and 309 extend through the bottom electrode 311 to metal lines 321 and 323 below. In some embodiments, the various contacts do not extend to metal lines below.

Arrows 313 and 315 shows the conductive path through the top electrode 305 and the bottom electrode 311, respectively. Each of the top contacts 301 and 303 and bottom contacts 307 and 309 is connected to conductive bumps and may be used to test various electrical properties of the MiM capacitor 303. The top conductive path 313 may be used alone to test a resistance across the top electrode 305 to ensure no delamination between the top electrode 305 and top contacts 301 and 303 has occurred. The bottom conductive path 315 may be used alone to test a resistance across the bottom electrode 311 to ensure no delamination between the bottom electrode 311 and the bottom contacts 307 and 309 has occurred. Even though as drawn the arrow line 315 appears to cross openings in the bottom electrode 311, the entire bottom electrode 311 is conductive through contiguous portions. In other words, the openings in the bottom electrode 311 to accommodate the top contacts 301 and 303 do not separate the bottom electrode into more than one piece. In a top view, the bottom electrode 311 appears as a geometric shape, for example, a rectangle, with two openings in the middle. Capacitance may be measured across the MiM capacitor 300 using one of the top contacts 301/303 and one of the bottom contacts 307/309.

Figure 4A:
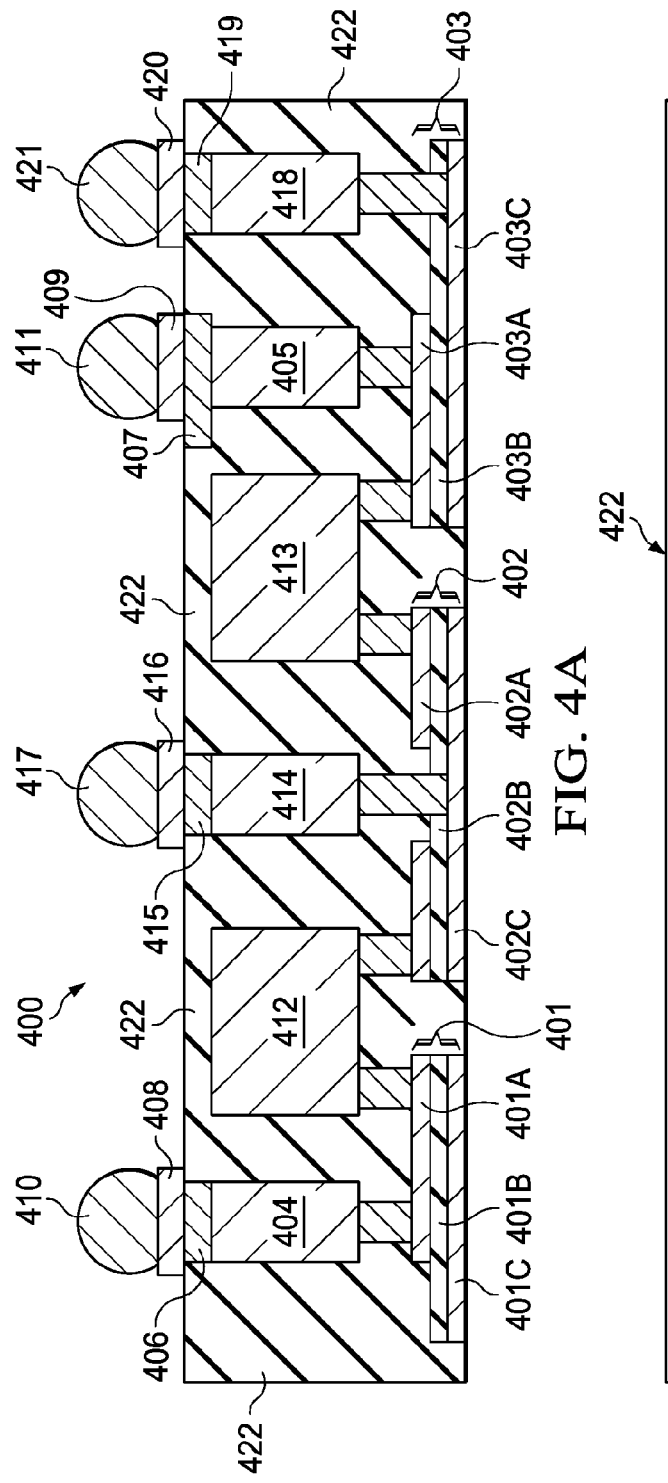
FIGS. 4A and 4B are a cross-sectional diagram and a top view of some of the layers of a number of MiM capacitors according to various embodiments.
Figure 4B:
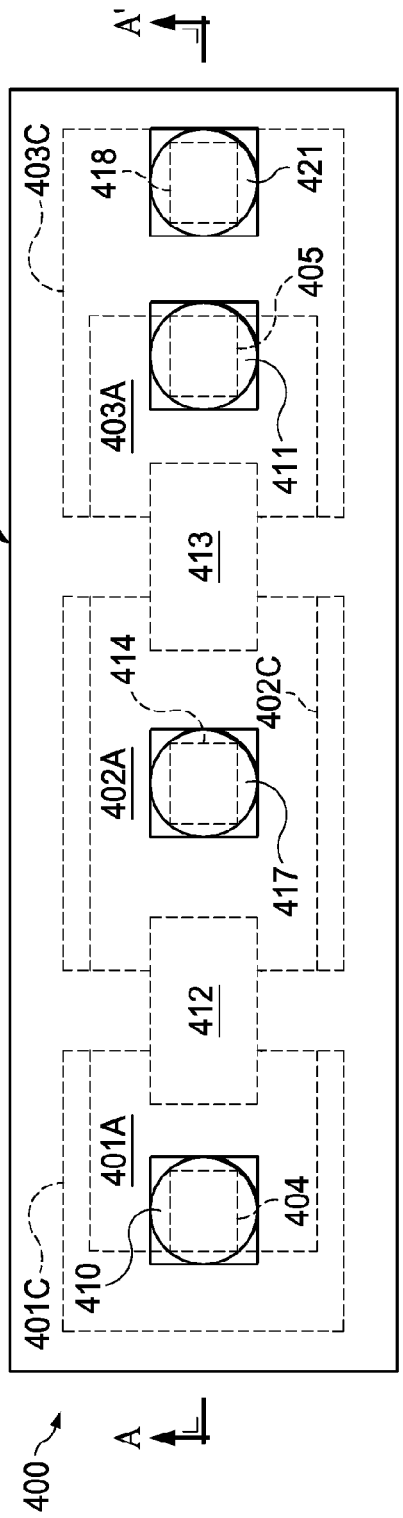
Figure 4C:
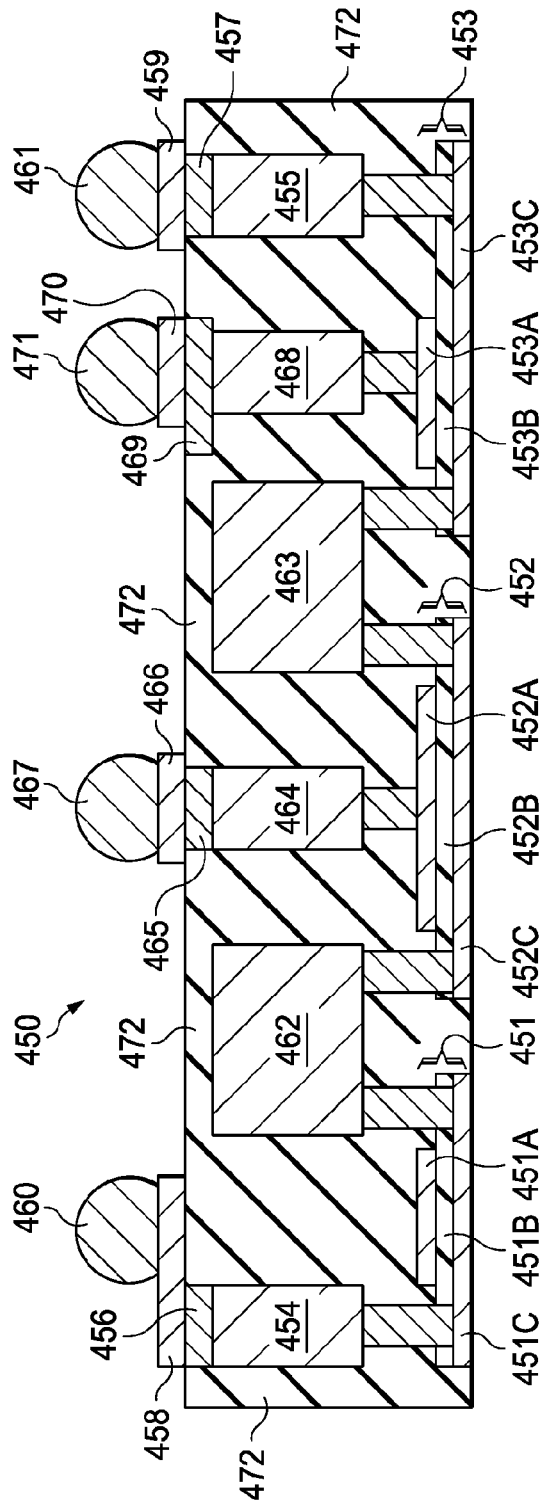
FIGS. 4C and 4D are a cross-sectional diagram and a top view of some of the layers of a number of MiM capacitors according to various embodiments.
Figure 4D:
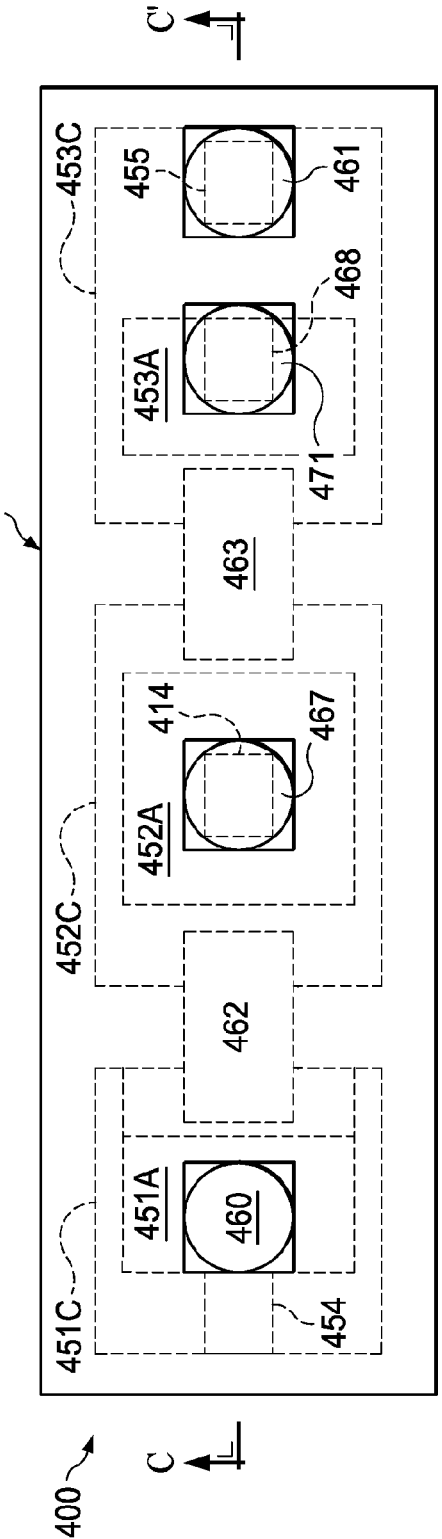
Figure 4E:
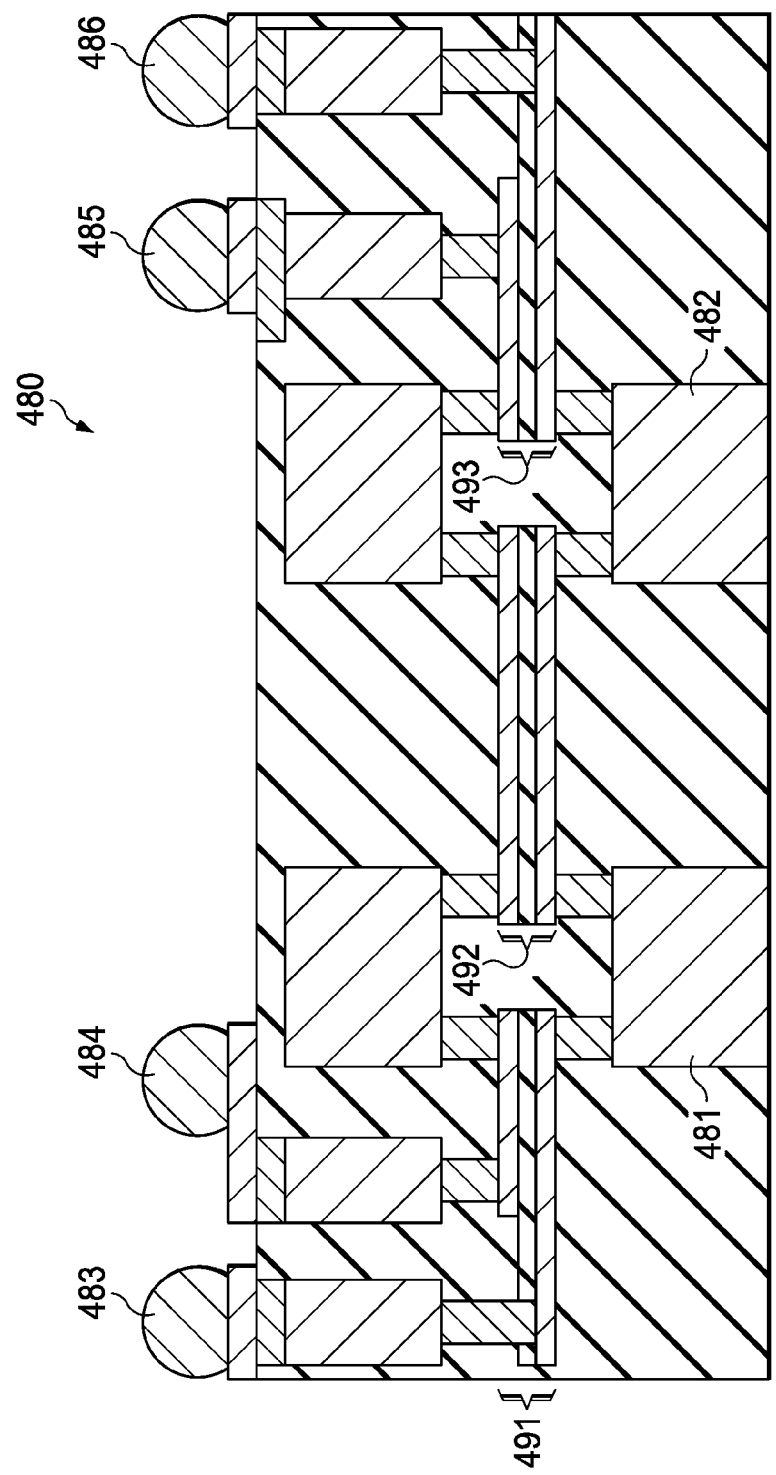
FIG. 4E is a cross-sectional diagram of MiM capacitors having both the top electrode and bottom electrode separated daisy chained in accordance with various embodiments of the present disclosure.

According to various embodiments of the present disclosure, multiple MiM capacitors may be connected together to test the top electrodes and/or the bottom electrodes of the multiple MiM capacitors without using two external bumps per electrode. FIGS. 4A, 4C, and 4E are cross sectional diagrams of MiM capacitor structures having three MiM capacitors with an internal contact or interconnection between adjacent MiM capacitors. FIG. 4B is a top view of some of the layers in the cross sectional structure of FIG. 4A. FIG. 4D is a top view of some of the layers in the cross sectional structure of FIG. 4C. The structure 400 of FIGS. 4A and 4B may be used to daisy chain top electrodes of different MiM capacitors. The structure 450 of FIGS. 4C and 4D may be used to daisy chain bottom electrodes of different MiM capacitors. In some embodiments, the structures 400 and 450 of FIGS. 4A/4B and 4C/4D are different cross sections of a set of MiM capacitors arranged in an array so that both the top electrodes and the bottom electrodes of the set of MiM capacitors are daisy chained respectively. The structure 480 of FIG. 4E is yet another embodiment where a metal level below is used to daisy chain the bottom electrodes of adjacent MiM capacitors.

FIGS. 4A and 4B include three MiM capacitors 401, 402, and 403 having top electrodes daisy-chained together. Each of the MiM capacitors 401, 402, and 403 includes a top electrode 401A, 402A, and 403A, a dielectric layer 401B, 402B, and 403B, and a bottom electrode 401C, 402C, and 403C, respectively. Top electrode contacts 404 and 405 connect the top electrodes 401A and 403A to redistribution layers 406 and 407, respectively, which are connected to under bump pads 408 and 409, respectively. The bumps 410 and 411 are disposed over the under bump pads 408 and 409 and are thus connected to the top electrodes 401A and 403A respectively. Top contact interconnect 412 connects the top electrode 401A to the top electrode 402A. Top contact interconnect 413 connects the top electrode 402A to the top electrode 403A.

FIG. 4B includes a cutline A-A' from which the cross sectional diagram of FIG. 4A is viewed. FIG. 4B is a simplified version of a layout of structure 400 with only the bottom electrodes, top electrodes, top/bottom contacts, and bumps shown. Other layers in FIG. 4A such as the under bump pad, redistribution layer, passivation layer, and the dielectric layer are not included.

A current path between the bumps 410 and 411 routes from the bump 410, under bump pad 408, redistribution layer 406, top contact 404, top electrode 401A of the MiM capacitor 401, top contact interconnect 412, top electrode 402A of the MiM capacitor 402, top contact interconnect 413, top electrode 403A of the MiM capacitor 403, top contact 405, redistribution layer 407, under bump pad 409, to the bump 411. The current path thus daisy chains the top electrodes of MiM capacitors 401, 402, 403 together. A resistance across this current path can be measured to determine whether the features along the path are electrically connected as expected.

FIG. 4A also includes contacts and bumps connected to bottom electrodes. The bottom electrode 402C is connected to a bottom contact 414, which is connected to redistribution layer 415, under bump pad 416, and bump 417. The bottom contact 414 connects to the bottom electrode 402C through an opening in the top electrode 402A of the MiM capacitor 402. As shown in FIG. 4B, the opening in the top electrode 402A of the MiM capacitor 402 does not run an entire length of the MiM capacitor 402, the top electrode 402A on either side of the opening is still electrically connected. Similarly, the bottom electrode 403C is connected to a bottom contact 418, which is connected to redistribution layer 419, under bump pad 420, and bump 421. The bottom contact 418 connects to the bottom electrode 403C through an opening in the top electrode 403A of the MiM capacitor 403. The bumps 410 and 417 may be used to measure a capacitance of the MiM capacitors 401 and 402. The bumps 410 and 421 may be used to measure a capacitance of the MiM capacitors 401, 402, and 403. The bumps 411 and 421 may be used to measure a capacitance of the MiM capacitor 403. In some embodiments, the bottom electrode 401C may be separately connected to an external bump to isolate the MiM capacitor 401 for a capacitance measurement. One may design a MiM capacitor structure having a number of MiM capacitors that allows measurement and isolation of faults. A measurement may be compared to an expected value.

In the structure 400 of FIG. 4A, features below the redistribution layer (406, 415, 407, 419) are embedded in a dielectric passivating material 422. The dielectric material 422 may include one or more layers of dielectrics including silicon oxide, silicon nitride, silicon carbide, silicon oxynitride, carbon-doped silicon oxide, carbon-doped silicon nitride, and other commonly used dielectric material in semiconductor processing.

In some embodiments, the bottom electrode contacts 414, 418 and respective bumps 417, 421, under bump pad 415, 420, and redistribution layer 415, 419 are not included in the structure 400. In these embodiments, the structure 400 minimizes the number of bumps used on the surface, reduces the size of the MiM capacitors, and allows the MiM capacitors to be close together. Structure 400 is used to verify the integrity of the top electrodes 401A, 402A, and 403A. For example, the MiM capacitor 402 may be small and has room for only two contacts to be formed over the MiM capacitor 402. A separate structure may be used to test the performance of the MiM capacitors.

FIG. 4C is a cross section diagram of a MiM capacitor structure 450 including three MiM capacitors 451, 452, and 453 having bottom electrodes daisy-chained together. FIG. 4D is a top view of some of the layers in the cross sectional structure of FIG. 4C. Each of the MiM capacitors 451, 452, and 453 includes a bottom electrode 451C, 452C, and 453C, a dielectric layer 451B, 452B, and 453B, and a top electrode 451A, 452A, and 453A, respectively. Bottom electrode contacts 454 and 455 connect the bottom electrodes 451A and 453A to redistribution layers 456 and 457, respectively, which is connected to under bump pads 458 and 459, respectively. The bumps 460 and 461 are disposed over the under bump pads 458 and 459 and are thus connected to the bottom electrodes 451C and 453C respectively. Bottom contact interconnect 462 connects the bottom electrode 451C to the bottom electrode 452C. Bottom contact interconnect 463 connects the bottom electrode 452C to the bottom electrode 453C.

FIG. 4D includes a cutline B-B' from which the cross sectional diagram of FIG. 4C is viewed. FIG. 4D is a simplified version of a layout of structure 450 with only the bottom electrodes, top electrodes, top/bottom contacts, and bumps are shown. Other layers in FIG. 4C such as the under bump pad, redistribution layer, passivation layer, and the dielectric layer are not included.

A current path between the bumps 460 and 461 routes from the bump 460, under bump pad 458, redistribution layer 456, bottom contact 454, bottom electrode 451C of the MiM capacitor 451, bottom contact interconnect 462, bottom electrode 452C of the MiM capacitor 452, bottom contact interconnect 463, bottom electrode 453C of the MiM capacitor 453, bottom contact 455, redistribution layer 457, under bump pad 459, to the bump 461. The current path thus daisy chains the bottom electrodes of MiM capacitors 451, 452, 453 together. A resistance across this current path can be measured to determine whether the features along the path are electrically connected as expected.

FIG. 4C also includes contacts and bumps connected to top electrodes. The top electrode 452A is connected to a top contact 464, which is connected to redistribution layer 465, under bump pad 466, and bump 467. Similarly, the top electrode 453A is connected to a top contact 468, which is connected to redistribution layer 469, under bump pad 470, and bump 471. The bumps 460 and 467 may be used to measure a capacitance of the MiM capacitors 451 and 452. The bumps 460 and 471 may be used to measure a capacitance of the MiM capacitors 451, 452, and 453. The bumps 461 and 471 may be used to measure a capacitance of the MiM capacitor 453. In some embodiments, the top electrode 451A may be separately connected to an external bump to isolate the MiM capacitor 451 for a capacitance measurement.

In the structure 450 of FIGS. 4C and 4D, features below the redistribution layer (456, 465, 457, 469) are embedded in a dielectric passivating material 472. The dielectric material 472 may include one or more layers of dielectrics including silicon oxide, silicon nitride, silicon carbide, silicon oxynitride, carbon-doped silicon oxide, carbon-doped silicon nitride, and other commonly used dielectric material in semiconductor processing.

In some embodiments, the top electrode contacts 464, 468 and respective bumps 467, 471, under bump pad 466, 470, and redistribution layer 465, 469 are not included in the structure 450. In these embodiments, the structure 450 minimizes the number of bumps used on the surface, reduces the size of the MiM capacitors, and allows the MiM capacitors to be close together. Structure 450 is used to verify the integrity of the bottom electrodes 451A, 452A, and 453A. For example, the MiM capacitor 452 may be small and has room for only two contacts to be formed over the MiM capacitor 452. A separate structure may be used to test the performance of the MiM capacitors.

According to some embodiments, structures 400 and 450 of FIGS. 4A/4B and 4C/4D may reflect different cross sections in an array of MiM capacitors. For example, MiM capacitor structures 401 and 451 of FIGS. 4A and 4C may be the same MiM capacitors. The top contact interconnects and the bottom contact interconnects may be in the same MiM capacitor array so that a variety of electrical tests may be performed. While FIGS. 4A/4B and 4C/4D includes only three MiM capacitors, an array of different numbers of MiM capacitors may be used according to concepts disclosed herein. For example, a daisy chain may include 2 to 10 top electrodes.

In some embodiments, the bottom contact interconnect may be formed in a metal layer below the MiM capacitors. FIG. 4E includes a structure 480 with bottom contact interconnects 481 and 482 in a metal layer below the MiM capacitors 491, 492, and 493. Structure 480 reduces the number of via landings on or over the MiM capacitors 491, 492, and 493, which may be useful when the MiM capacitors are small. As shown, structure 480 includes bumps 483-486. Bump 483 is connected to a bottom electrode of the MiM capacitor 491. Bump 484 is connected to a top electrode of the MiM capacitor 491. Bump 485 is connected to a top electrode of the MiM capacitor 493. Bump 486 is connected to a bottom electrode of the MiM capacitor 493. A resistance may be measured across bumps 484 and 485 or bumps 483 and 486 to determine electrical connectivity of the intervening features. Capacitance may be measured between 484 and 486 or 483 and 485 for MiM capacitors 491, 492, and 493.

In some embodiments, one or more of the top electrode contacts and the bottom electrode contacts may extend through the MiM capacitor structure to a layer below. This design allows the same bump to be used for more than one type of test. For example, the bump may also be connected to a memory cell or logic circuit below the MiM capacitor which may be tested through output to different bumps.

Figure 5:
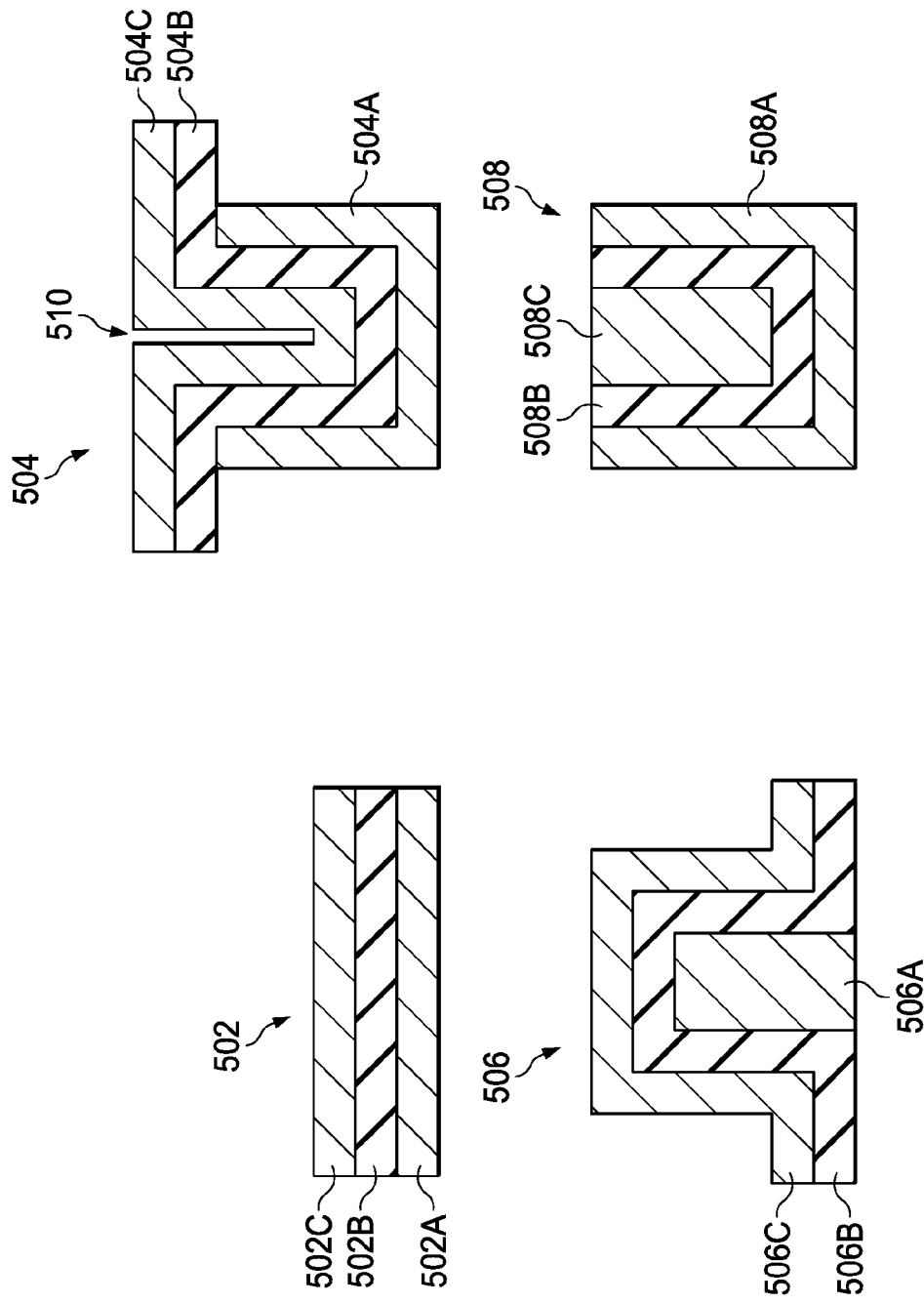
FIG. 5 depicts a plurality of MiM decoupling capacitor types that may be used in some embodiments.

Various embodiments of the invention are applicable to MiM capacitors of different configurations and are not limited to the planar MiM capacitors shown in FIGS. 1 to 4C. One skilled in the art may apply the concepts disclosed to various types of MiM capacitor structures. FIG. 5 depicts some types of MiM capacitive structures, including a planar-type MiM structure 502, a cylinder- or cup-type MiM structure 504, a bar-type MiM structure 506, and a dual-damascene MiM structure 508, which is a MiM structure formed by a dual-damascene process. Each of these MiM capacitor structures includes a top and a bottom electrode on either side of a dielectric layer. As discussed, a planar-type MiM structure 502 includes a bottom electrode 502A, a dielectric layer 502B, and a top electrode 502C sandwiched together. Cylinder-type MiM structure 504 has a rectangular cross-section when viewed from the side as in FIG. 5. When viewed from above, it has a circular cross-section. As depicted in FIG. 5, cylinder-type MiM structure 504 may include a gap 510 in the top electrode 504C, a dielectric layer 504B under the top electrode 504C, and a bottom electrode 504A. In some embodiments, gap 510 is present as depicted, while in others gap 510 is absent. MiM capacitor structure 506 is a bar-type capacitor with a top electrode 506C, a dielectric layer 506B and a bottom electrode 506A. MiM decoupling capacitor 508 is a dual-damascene MiM structure 508 with a top electrode 508C, a dielectric layer 508B and a bottom electrode 508A.

Figure 6A:
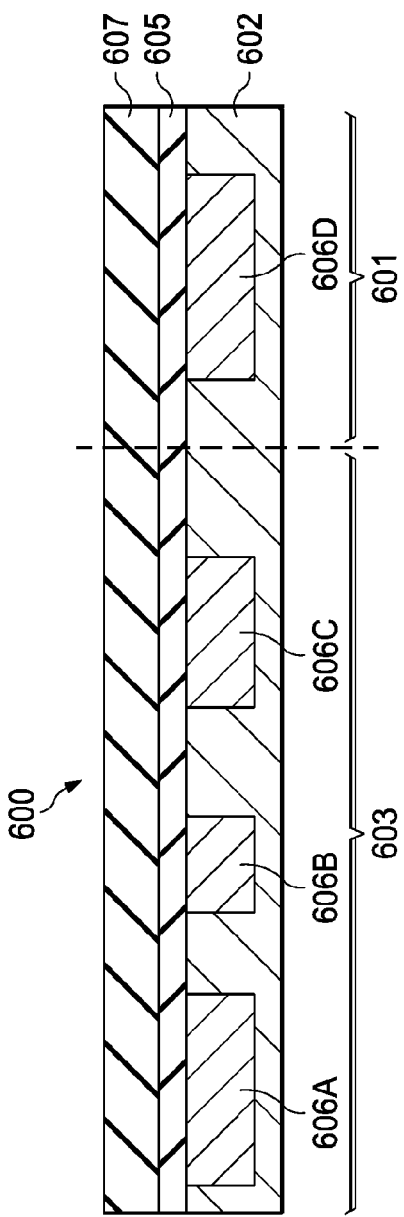

Different process techniques can be used to fabricate the above-listed MiM capacitors. FIGS. 6A-L are cross-sectional representations of a device 600, which may be similar in many respects to the MiM capacitor SOC 200 discussed in association with FIG. 2. FIG. 6A includes a logic area 601 and a decoupling capacitor area 603. Each of these two areas includes a portion of a substrate and of intermediate layer. Intermediate layer includes a plurality of semiconductor device layers that, for convenience and clarity, are not individually shown. The intermediate layer may include polysilicon gate and contact layers, gate and other oxide layers, interconnects between metallization layers, metallization layers, IMD layers, and others. Thus, for example, intermediate layer includes a first metal layer to a metal layer immediately below the top metal layer and all layers embedded therein. The device 600 cross-section in FIG. 6A also includes a plurality of metallization layer contact areas embedded in a metal layer 602. As shown, the plurality includes metallization layer contact areas 606A, 606B, 606C, and 606D which may have been patterned prior to the deposition of passivation layers 605 and 607. In some embodiments, a first passivation layer 605 of silicon carbide is deposited over a planarized surface of metal contact areas 606A, 606B, 606C, and 606D. A second passivation layer 607 of silicon oxide is deposited over the first passivation layer. The first passivation layer 605 may be about 500 angstroms and the second passivation layer 607 may be about 1000 angstroms.

Figure 6B:
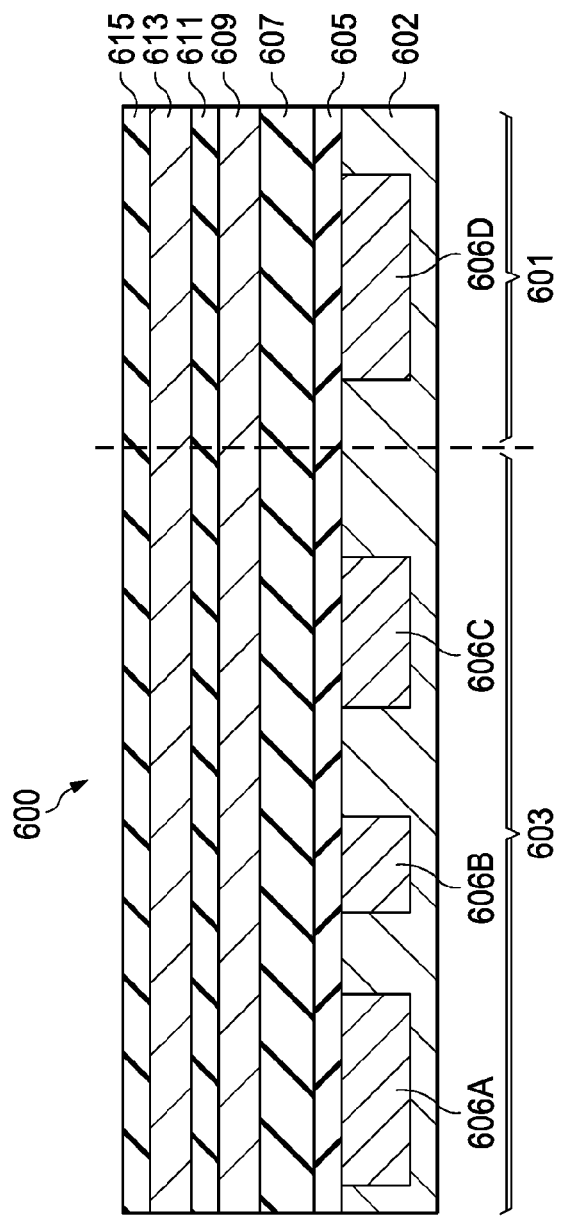

FIG. 6B includes a bottom conductive layer 609, a dielectric layer 611, a top conductive layer 613, and a hardmask layer 615. The bottom conductive layer may be formed of many different materials, and may include a plurality of layers of a single material or of different materials. In general, bottom conductive layer 609 can be made of metals and conductive metal nitrides, for example, titanium nitride, though any suitable conductor may be used. Bottom conductive layer 609 may be fabricated using a variety of deposition processes, including vapor deposition processes, filament evaporation, e-beam evaporation, and sputtering. Any suitable deposition process may be used to form the bottom conductive electrode layer 609. In some embodiments, the bottom conductive layer may be between about 200 and 500 angstroms, for example, about 350 angstroms.

Device 600 also includes an insulating layer or dielectric layer 611. The insulating dielectric layer 611 is formed over the bottom conductive electrode layer 609. In general, the insulating layer may be formed of an insulating material, including the specific materials already noted. These materials may include high-k dielectrics, for example, zirconium oxide. Suitable processes include chemical vapor depositions (CVD), such as low-pressure CVD (LPCVD), plasma-enhanced CVD (PECVD), and atomic layer deposition. In general, any suitable process for depositing the dielectric layer may be used. In some embodiments, the dielectric layer 611 is about 100 angstroms.

Device 600 includes a top conductive layer 613 overlaying the dielectric layer 611. While the top conductive layer 613 may include a different material or materials from bottom conductive layer 609, the kinds of materials from which, and processes by which, top conductive layer 613 may be made are substantially the same as those of bottom conductive layer 609. Any of those processes or materials may be used to form the top conductive layer 613. Overlaying the top conductive layer 613 is a first hardmask layer 615, which may be a silicon nitride, silicon oxide, or silicon oxynitride. According to various embodiments, a photoresist (PR) layer is used over the first hardmask layer. A PR layer may be used over the first hardmask layer to pattern it before etching the top conductive layer 613. The etching process may be a wet chemical etching with a variety of chemical etchants or may also be a physical or dry etching process such as plasma etching, sputter etching, reactive ion etching or vapor phase etching.

Figure 6C:
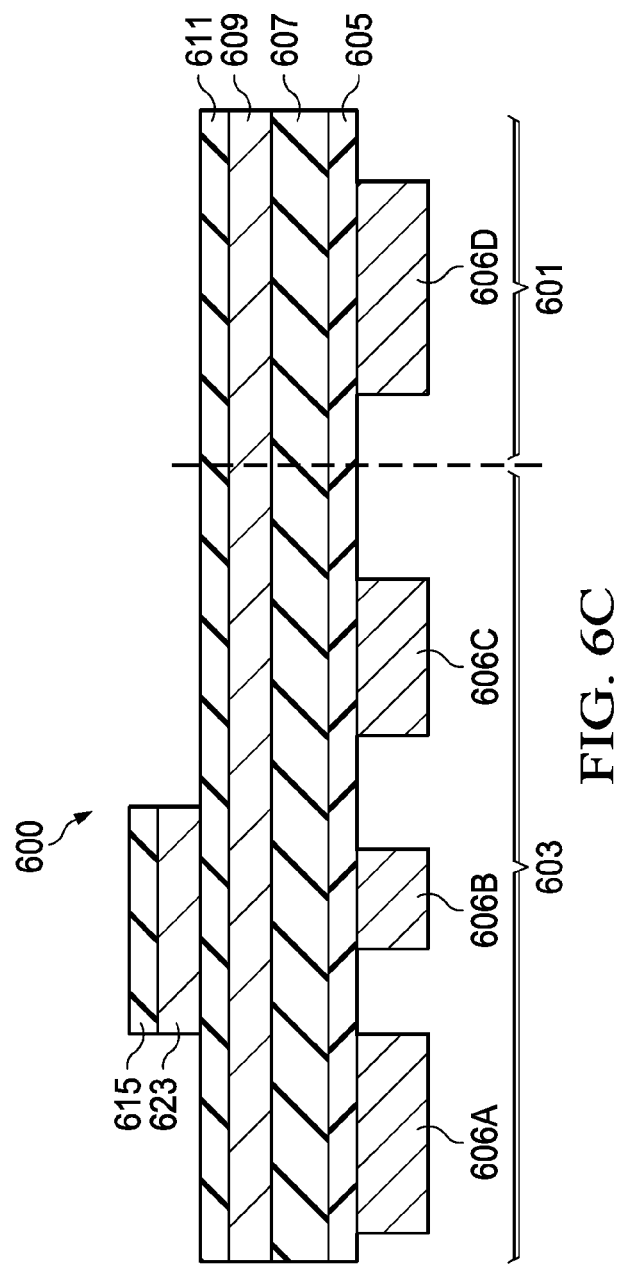

In FIG. 6C, after an etching process, the first hardmask layer 615 has been patterned so as the form an etch mask and a top electrodes 623 is etched under the first hardmask layer 615. Top electrode 623 functions as a top electrode in a MiM structure, for example, a MiM decoupling capacitor. In the logic area 601, the top conductive layer is removed.

In FIG. 6D, a second hardmask layer 617 is deposited over the substrate. The second hardmask layer 617 covers the first hardmask layer 615, the sidewalls of the top electrode 623, and over exposed portions of the dielectric layer 611. The second hardmask layer 617 may be silicon nitride or silicon oxide. In some embodiments, the second hardmask layer 617 is a silicon nitride about 500 angstroms thick.

Figure 6E:
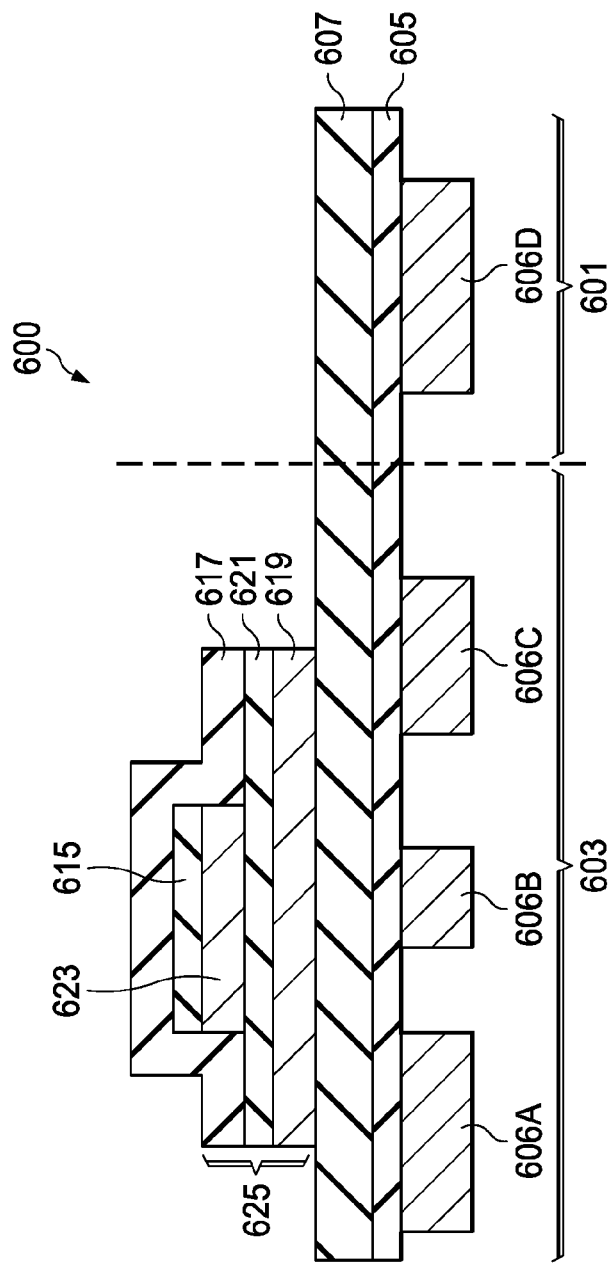

In FIG. 6E, the first passivation layer 617 is patterned and etched through the underlying dielectric layer and bottom conductive layer to the second passivation layer 607. The resulting device 600 includes a dielectric layer 621 and a bottom electrode 619. The top electrode 623, the dielectric layer 621, and the bottom electrode 619 together forms the MiM capacitor 625.

Figure 6F:
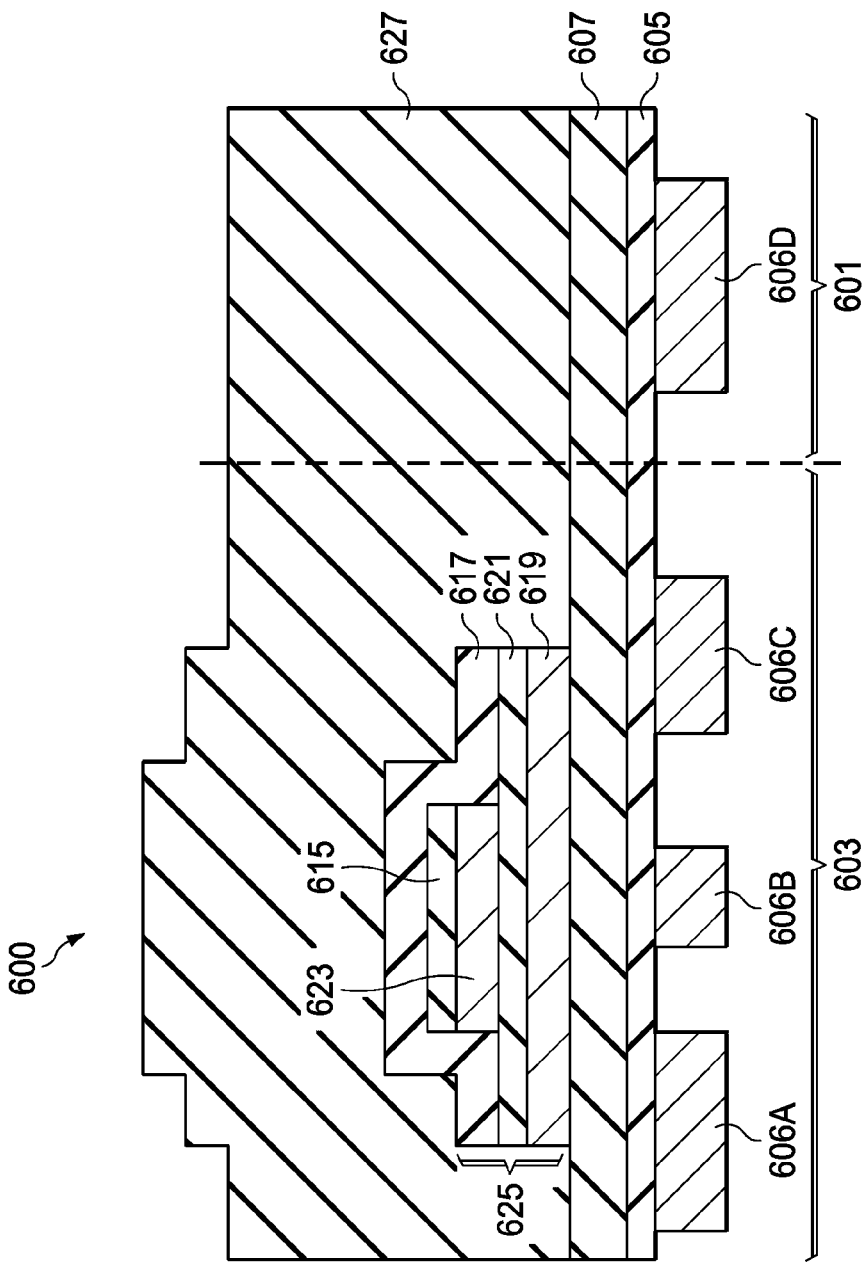
Figure 6G:
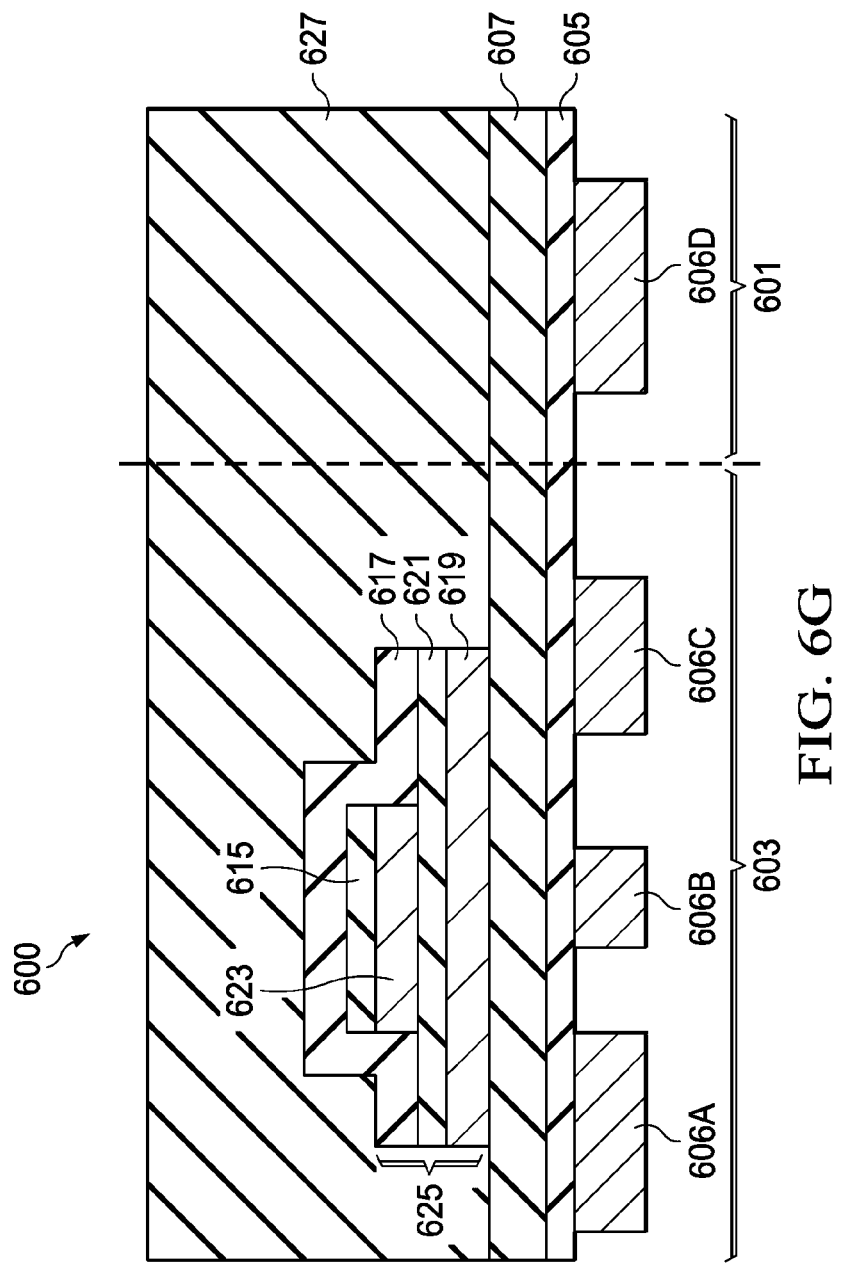

In FIG. 6F, a third passivation layer 627 is deposited over the substrate. The third passivation layer 627 may be a same material as the second passivation layer 607. In some embodiments, the third passivation layer 627 is a silicon oxide having a thickness of about 10,000 angstroms, or about 900 angstroms. The third passivation layer 627 is then planarized as shown in FIG. 6G.

Figure 6H:
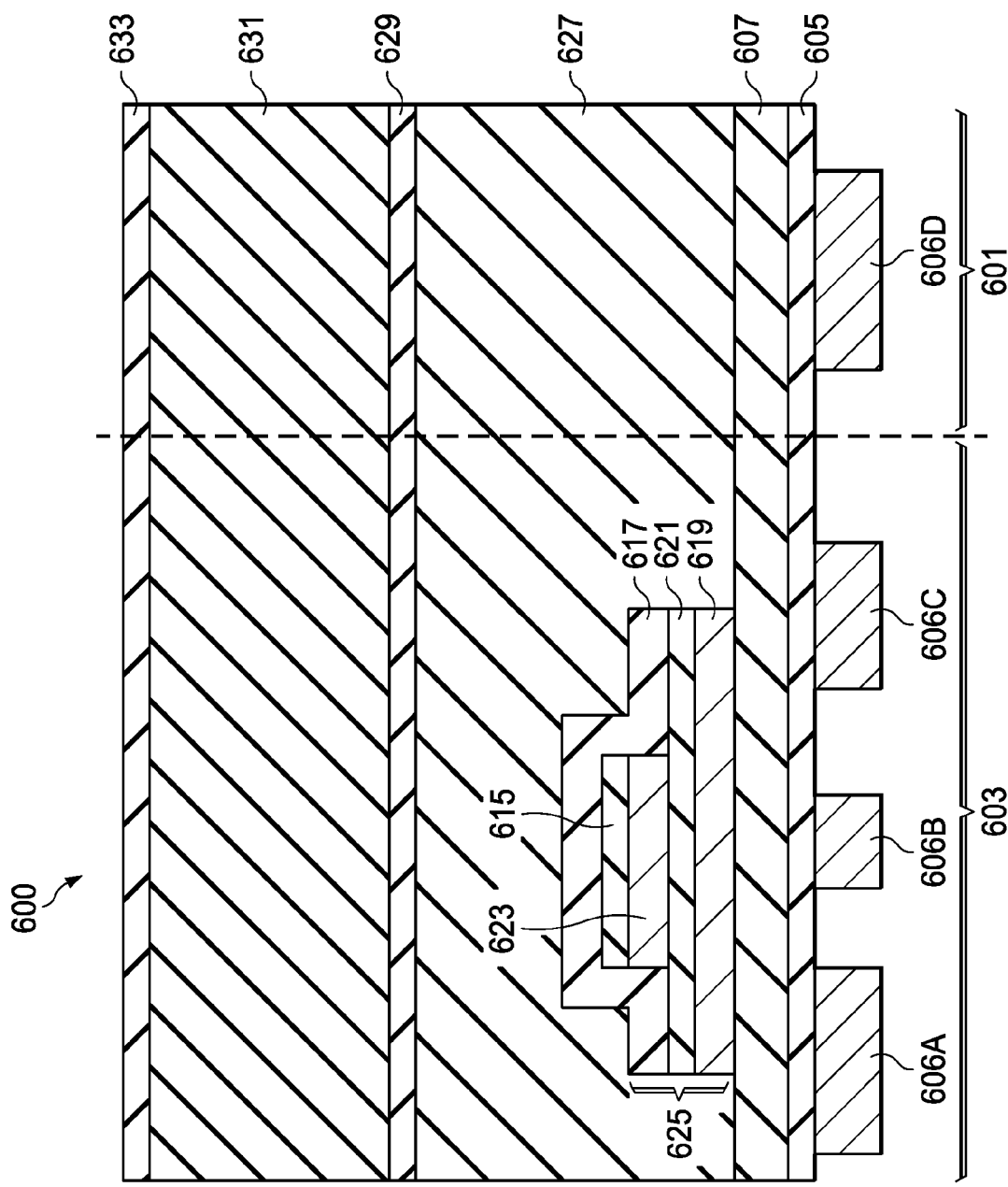

As shown in FIG. 6H, additional passivating material is deposited over the third passivation layer 627. A third hardmask layer 629 is deposited over the third passivation layer 627. A fourth passivation layer 631 is deposited over the third hardmask layer 629. A fourth hardmask layer 633 is deposited over the fourth passivation layer 631. The third and fourth hardmask layers and the fourth passivation layer are deposited together with dual damascene processing in the logic area and elsewhere on the device 600. In some embodiments, the third hardmask layer 629 is a silicon nitride having a thickness of about 500 angstroms. The fourth passivation layer 631 is a silicon oxide having a thickness of about 10000 angstroms, or about 9000 angstroms. The fourth hardmask layer 633 is a silicon oxynitride having a thickness about 500 angstroms or about 600 angstroms.

Figure 6I:
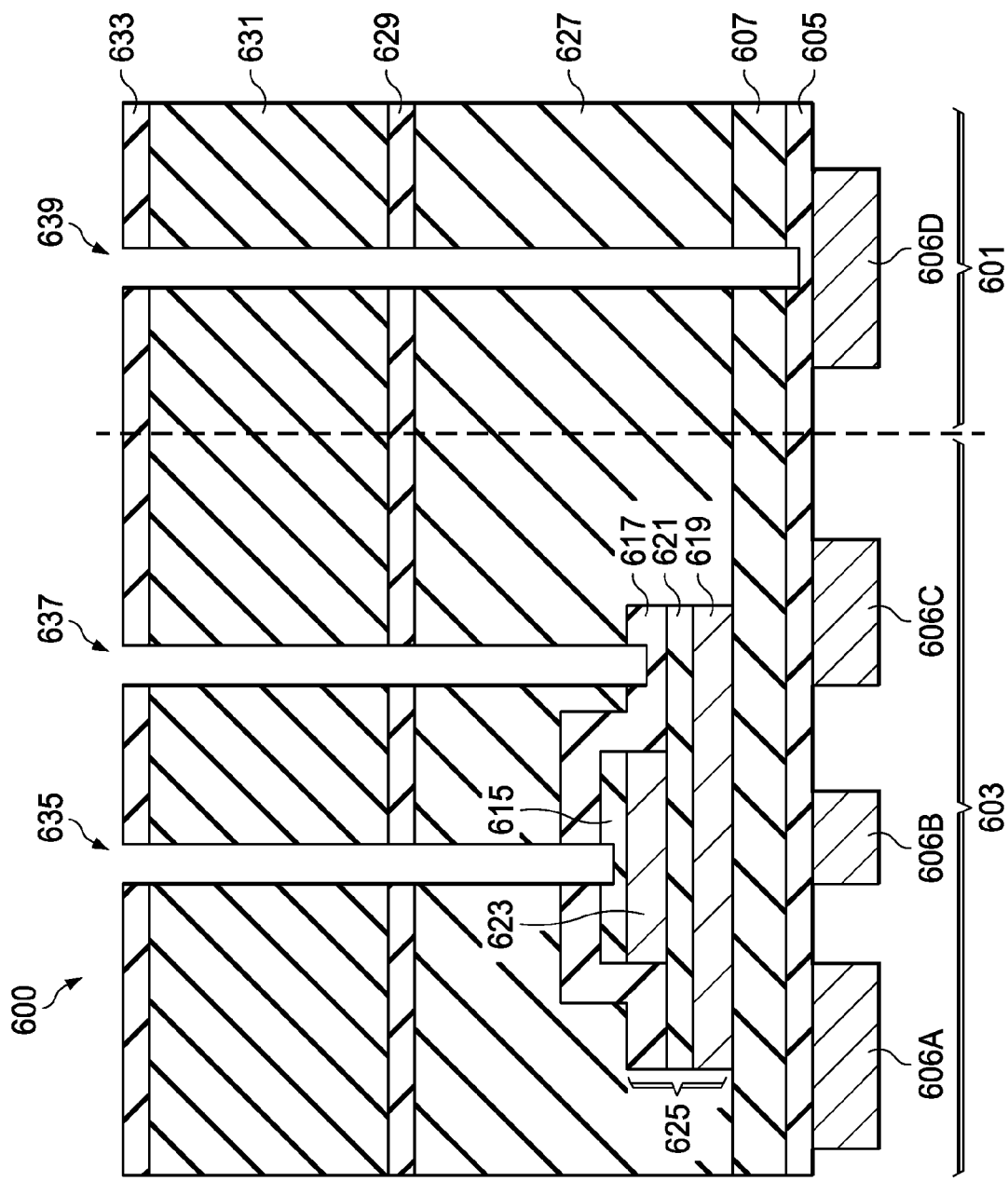

In FIG. 6I, openings 635, 637, and 639 are made in the device 600 by patterning the fourth hardmask layer 633 and etching through the fourth passivation layer 631, the third hardmask layer 629, and the third passivation layer 627. The opening 635 lands on the second hardmask layer 617 above the top electrode 623. The opening 637 lands on the second hardmask layer 617 above the dielectric layer 621. The opening 639 lands on the first passivation layer 605. Because the openings 635, 637, and 639 have different depths, one or more etch end point detections may be used to detect when the second hardmask layer 617 is reached. Thereafter, the etch may proceed until the first passivation layer 605 is detected. In some embodiments, the first passivation layer 605 is silicon carbide, which is different from the second hardmask layer 617 of silicon nitride. In other embodiments, the second hardmask layer 617 and the first passivation layer 605 are of the same material, which is designed to have a higher etch selectivity than the overlying third passivation layer 627. The etch process may be tuned to proceed a certain amount after detecting the second hardmask layer 617 so that the second hardmask layer 617 is not etched through.

Figure 6J:
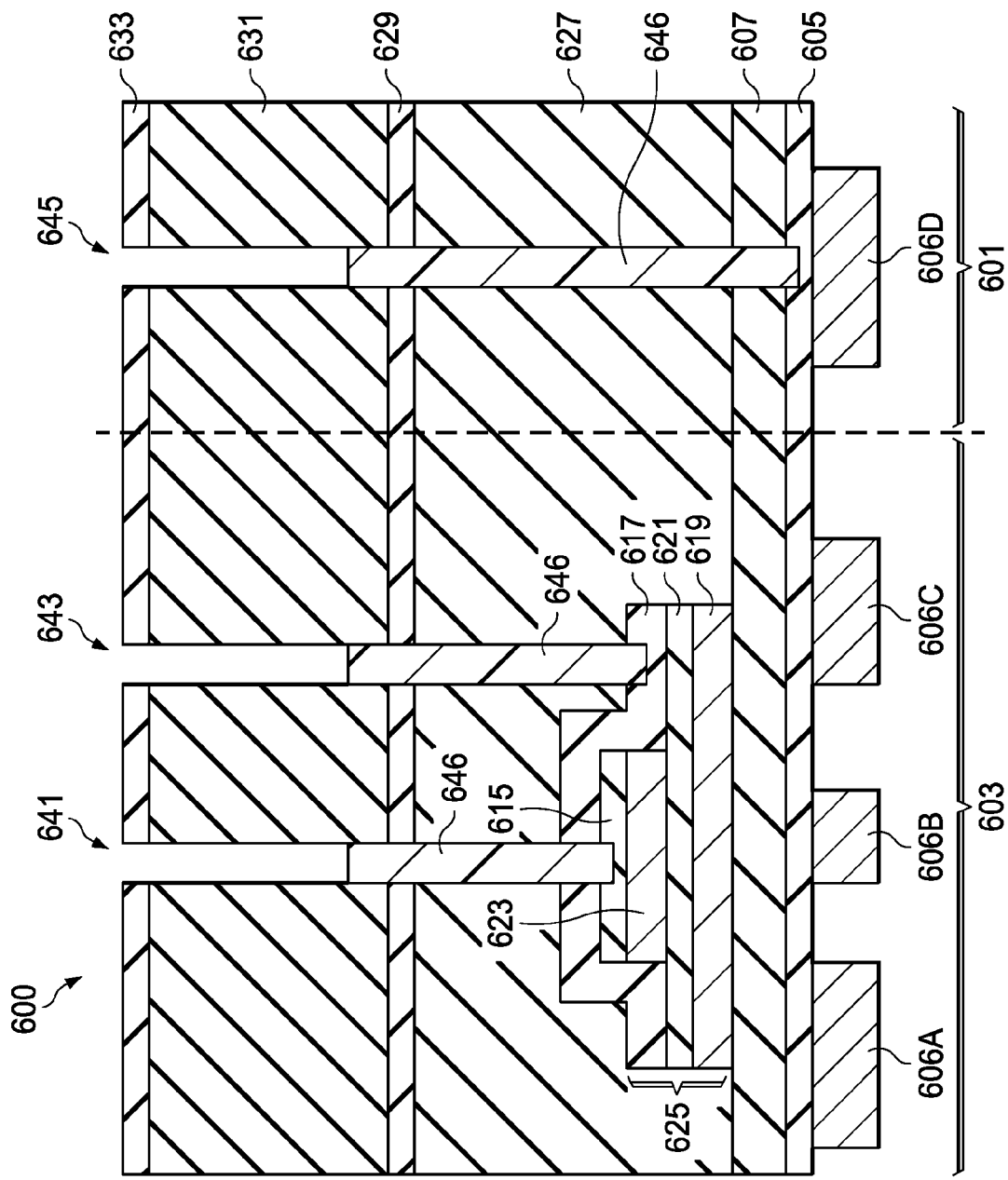

In FIG. 6J, a photoresist 646 is deposited in the openings and etched back to protect the via portions of the contacts. The etch back process forms openings 641, 643, and 645 have about the same depth. The remainder portions of the openings 635, 637, and 639 of FIG. 6I are filled with the photoresist material 646.

Figure 6K:
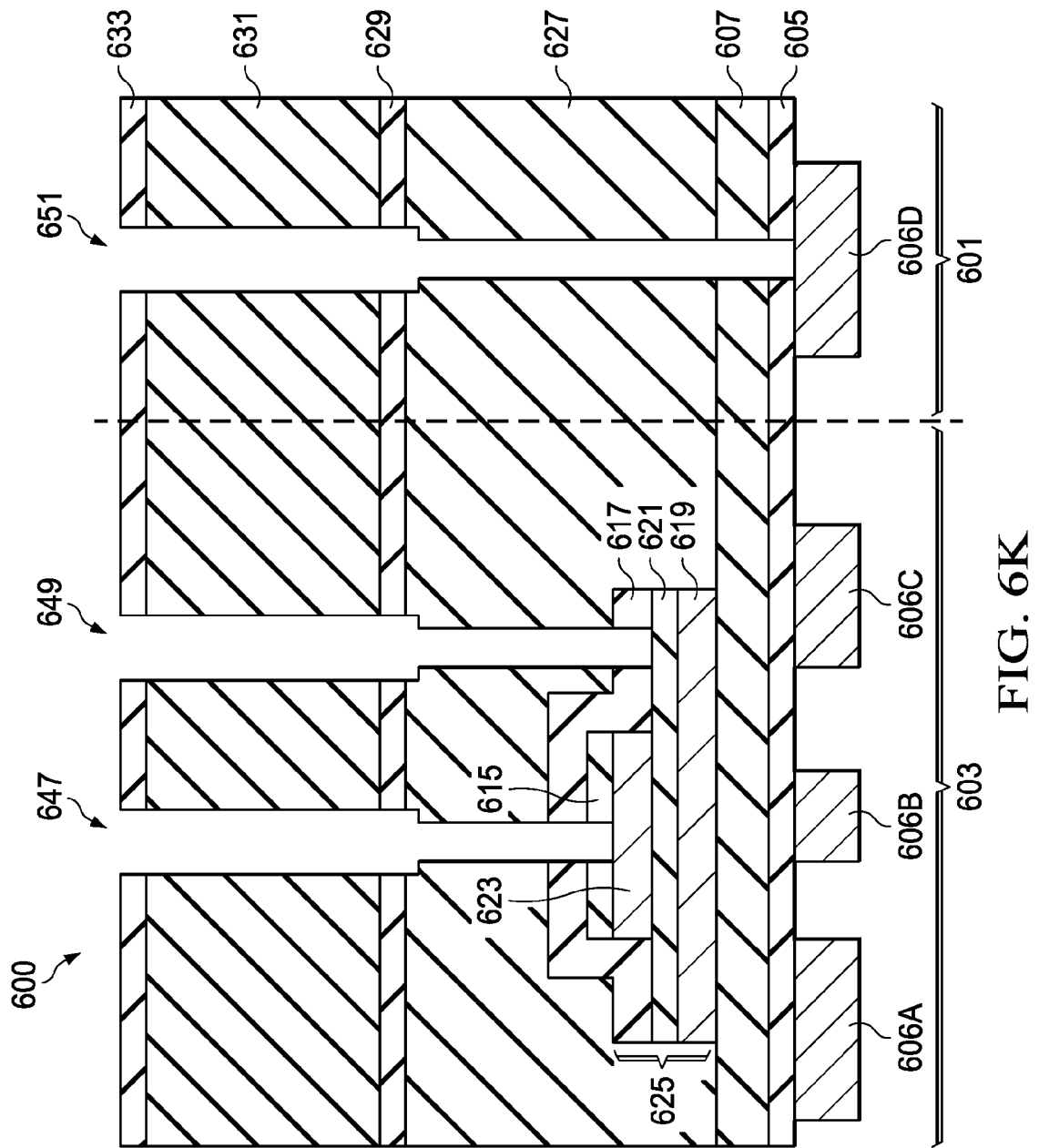

In FIG. 6K, trenches 647, 649, and 651 are etched about the openings 641, 643, and 645 from FIG. 6J in a damascene process. The etch process also removes the photoresist material 646 and extends the openings 641, 643, and 645 to reach conductive layers below. One or more etch point detections may be used to detect titanium nitride and copper. When one conductive material is detected, the etch may proceed slowly until the second conductive material is detected. The trenches 647 and 649 are used to form contacts to the MiM capacitor 625. A via portion below trench 647 exposes the top electrode 623. A via portion below trench 649 exposes the bottom electrode 619. A via portion below trench 651 exposes an underlying metal line 606D.

Figure 6L:
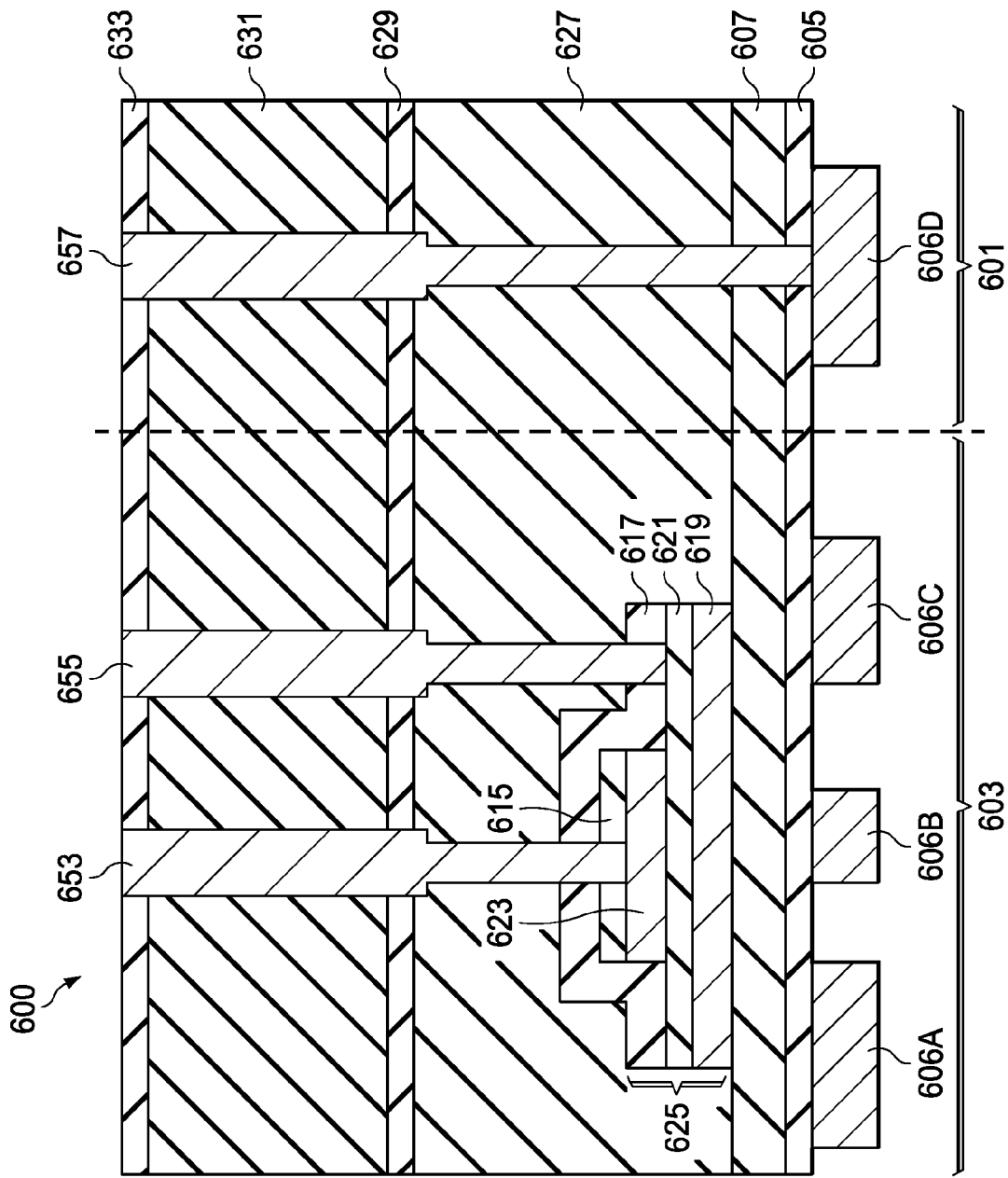

In FIG. 6L, the trench and via portions are filled with a conductive material, usually copper to form contacts 653, 655, and 657. Contact 653 is a top contact. Contact 655 is a bottom contact. Contact 657 connects to metal line 606D in the logic area. The device 600 of FIG. 6L is the same as the SOC 200 of FIG. 2. After forming the device 600 of FIG. 6L, additional metal layers may be formed over the contacts 653, 655, and 657 or, if the contacts 653, 655, and 657 are in the top metal layer, then a redistribution layer, under bump pad, and bumps may be formed over the contacts 653, 655, and 657.

The process used to form the cross section diagrams of FIGS. 6A to 6L may be modified to form the MiM capacitor structures of FIGS. 3 and 4A to 4C. For the structure 300 of FIG. 3, an addition patterning and etching operation is added after depositing the bottom conductive layer 609 of FIG. 6B to create openings in the bottom electrode for the top contacts to reach the metal lines below. The etch operation to form the openings 635, 637, and 639 is adjusted so that openings 635 and 637 reaches the underlying metal lines by reducing the thickness of hardmask 617 in FIG. 6I. The structure 400 of FIG. 4A and structure 450 of FIG. 4B may be formed using the process described in association with FIGS. 6A to 6L by merely changing the photomask layout. The structure 480 of FIG. 4C may be formed by first forming conductive via structures through the first and second passivation layers 605 and 607 in FIG. 6A before any conductive layers are deposited in FIG. 6B.

In one aspect, the present disclosure pertains to a semiconductor device. The semiconductor device includes a bottom electrode, a dielectric layer located above, and in physical contact with, the bottom electrode, a top electrode located above, and in physical contact with, the dielectric layer, a first top contact contacting the top electrode, a first bottom contact contacting the bottom electrode from a top electrode direction, a first metal bump connecting to the top contact, and a second metal bump connecting to the bottom contact. The top electrode having a smaller area than the bottom electrode. The bottom electrode, the dielectric layer, and the top electrode is a first metal-insulator-metal (MiM) capacitor. The semiconductor device may also include one or more second MiM capacitor with corresponding top contacts and top electrode interconnects between adjacent top electrodes of adjacent MiM capacitors.

In another aspect, the present disclosure pertains to a semiconductor device. The semiconductor device includes a bottom electrode, a dielectric layer located above, and in physical contact with, the bottom electrode, a top electrode located above, and in physical contact with, the dielectric layer, a first top contact contacting the top electrode, a first bottom contact contacting the bottom electrode from a top electrode direction through the openings in the top electrode, a first metal bump connecting to the top contact, a second metal bump connecting to the bottom contact, and at least one of a second top contact contacting the top electrode and a second bottom contact contacting the bottom electrode. The bottom electrode, the dielectric layer, and the top electrode is a first metal-insulator-metal (MiM) capacitor.

In yet another aspect, the present disclosure pertains to a method for testing MiM capacitors. The method includes forming a first MiM capacitor, forming a first top contact in contact with a top electrode of the first MiM capacitor, forming a first bottom contact in contact with a bottom electrode of the first MiM capacitor through an opening of the top electrode of the first MiM capacitor, forming metal bumps over the first top contact and the first bottom contact, and measuring electrical properties of the first MiM capacitor through the metal bumps. Additionally, resistance across several top electrodes may be measured by daisy-chaining the top electrodes of adjacent MiM capacitors and resistance across several bottom electrodes may be measured by daisy-chaining the bottom electrodes of adjacent MiM capacitors. The measurements may be compared and analyzed to localize a manufacturing issue.

In yet another aspect, the present disclosure pertains to a method for forming a semiconductor device. The method includes forming a bottom electrode over a substrate, forming a capacitor dielectric over the bottom electrode, and forming a top electrode over the capacitor dielectric, the bottom electrode, the capacitor dielectric, and the top electrode forming a first MiM capacitor. A plurality of one and at least one of the other of (a) first top conductive features in contact with the top electrode of the first MiM capacitor and (b) first bottom conductive features in contact with the bottom electrode of the first MiM capacitor are formed. A metal bump is formed over at least one of the first top and bottom conductive features.

In yet another aspect, the present disclosure pertains to a method for forming a semiconductor device. The method includes forming a plurality of MiM capacitors, each of the MiM capacitors having a bottom electrode, a top electrode, and a dielectric layer interposed between the bottom electrode and the top electrode, each of the bottom electrodes being discontinuous from the bottom electrodes of other MiM capacitors. One or more bottom contact interconnects are formed, each bottom contact interconnect electrically coupling bottom electrodes of adjacent MiM capacitors, the one or more bottom contact interconnects being completely covered by a dielectric material. A first top contact is formed electrically coupled to a first top electrode of a first MiM capacitor of the plurality of MiM capacitors, and a first bottom contact is formed contacting at least one of the bottom electrodes from a top electrode direction, the first bottom contact being distinct from the one or more bottom contact interconnects.

In yet another aspect, the present disclosure pertains to a method for forming a semiconductor device. The method includes forming a first MiM capacitor over a substrate, forming a second MiM capacitor over the substrate, each of the first MiM capacitor and the second MiM capacitor having a top electrode and a bottom electrode, and forming a dielectric layer over the first MiM capacitor and the second MiM capacitor. A plurality of first vias through the dielectric layer to one of the top electrode of the first MiM capacitor and the bottom electrode of the first MiM capacitor, and a single second via is formed to the other of the top electrode of the first MiM capacitor and the bottom electrode of the first MiM capacitor.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   forming a bottom electrode over a substrate;
   forming a capacitor dielectric over the bottom electrode;
   forming a top electrode over the capacitor dielectric, the bottom electrode, the capacitor dielectric, and the top electrode forming a first MiM capacitor;
   forming a plurality of one and at least one of the other of
   (a) first top conductive features in contact with the top electrode of the first MiM capacitor and (b) first bottom conductive features in contact with the bottom electrode of the first MiM capacitor, the forming the first top conductive features and the first bottom conductive features comprising:
forming one or more first dielectric layers over the top electrode;
forming at least one first opening to the top electrode and at least one second opening to the bottom electrode;
forming a second dielectric layer in a lower portion of the first opening and the second opening, an upper surface of the second dielectric layer being recessed from an upper surface of the one or more first dielectric layers;
widening an upper portion of the first opening and the second opening while the second dielectric layer is in the lower portion of the first opening and the second opening;
removing the second dielectric layer from the first opening and the second opening; and
filling the first opening and the second opening with a conductive material; and
forming a metal bump over at least one of the first top and bottom conductive features.

2. The method of claim 1, wherein the forming the plurality of one and at least one of the other comprises forming a plurality of first bottom conductive features, the plurality of first bottom conductive features extending through openings in the top electrode of the first MiM capacitor.

3. The method of claim 1, wherein the first MiM capacitor comprises a first MiM feature and a second MiM feature, each of the first MiM feature and the second MiM feature having a top conductive layer, a bottom conductive layer, and a dielectric layer interposed between the top conductive layer and the bottom conductive layer, the top conductive layer of the first MiM feature being discontinuous from the top conductive layer of the second MiM feature, the bottom conductive layer of the first MiM feature being discontinuous from the bottom conductive layer of the second MiM feature.

4. The method of claim 3, further comprising forming a first interconnect over the top electrode, the first interconnect coupling the top conductive layer of the first MiM feature to the top conductive layer of the second MiM feature.

5. The method of claim 3, further comprising forming a second interconnect below the bottom electrode, the second interconnect coupling the bottom conductive layer of the first MiM feature to the bottom conductive layer of the second MiM feature.

6. The method of claim 1, wherein the bottom electrode comprises one or more of a plurality of discontinuous sections of a conductive layer, and further comprising forming one or more interconnects coupling adjacent ones of the plurality of discontinuous sections of the conductive layer.

7. The method of claim 1, wherein the top electrode comprises one of a plurality of discontinuous sections of a conductive layer, and further comprising forming one or more interconnects coupling adjacent ones of the plurality of discontinuous sections of the conductive layer.

8. The method of claim 1, further comprising measuring electrical properties of the top electrode using a plurality of metal bumps coupled to the first top conductive features.

9. The method of claim 1, further comprising measuring electrical properties of the bottom electrode using a plurality of metal bumps coupled to the first bottom conductive features.

10. A method for forming a semiconductor device, the method comprising:
forming a plurality of MiM capacitors, each of the MiM capacitors having a bottom electrode, a top electrode, and a dielectric layer interposed between the bottom electrode and the top electrode, each of the bottom electrodes being discontinuous from the bottom electrodes of other MiM capacitors;
forming one or more bottom contact interconnects, each bottom contact interconnect electrically coupling bottom electrodes of adjacent MiM capacitors, the one or more bottom contact interconnects being completely covered by a dielectric material;
forming a first top contact electrically coupled to a first top electrode of a first MiM capacitor of the plurality of MiM capacitors; and
forming a first bottom contact contacting at least one of the bottom electrodes from a top electrode direction, the first bottom contact being distinct from the one or more bottom contact interconnects.

11. The method of claim 10, wherein the plurality of MiM capacitors include a second MiM capacitor, further comprising forming a second top contact electrically coupled to a second top electrode of the second MiM capacitor.

12. The method of claim 11, further comprising measuring electrical properties between the first top contact and the second top contact.

13. The method of claim 12, further comprising measuring electrical properties between the first top contact and the first bottom contact.

14. The method of claim 11, further comprising forming a second bottom contact contacting at least another one of the bottom electrodes from the top electrode direction, the second bottom contact being distinct from the one or more bottom contact interconnects.

15. A method for forming a semiconductor device, the method comprising:
forming a first MiM capacitor over a substrate;
forming a second MiM capacitor over the substrate, each of the first MiM capacitor and the second MiM capacitor having a top electrode and a bottom electrode;
forming a dielectric layer over the first MiM capacitor and the second MiM capacitor;
forming a plurality of first vias through the dielectric layer to one of the top electrode of the first MiM capacitor and the bottom electrode of the first MiM capacitor; and
forming a single second via to the other of the top electrode of the first MiM capacitor and the bottom electrode of the first MiM capacitor.

16. The method of claim 15, wherein at least one the plurality of first vias extend to an interconnect, and further comprising forming a third via extending from the interconnect to the second MiM capacitor.

17. The method of claim 16, wherein the third via extends to the top electrode of the second MiM capacitor.

18. The method of claim 16, wherein the third via extends to the bottom electrode of the second MiM capacitor.

19. The method of claim 15, wherein the second via extends through the top electrode of the first MiM capacitor.

20. The method of claim 10, wherein forming the first top contact and forming the first bottom contact comprises:

forming one or more first dielectric layers over the first top electrode;

forming at least one first opening to the first top electrode and at least one second opening to the first bottom electrode;

forming a second dielectric layer in a lower portion of the first opening and the second opening, an upper surface of the second dielectric layer being recessed from an upper surface of the one or more first dielectric layers;

widening an upper portion of the first opening and the second opening while the second dielectric layer is in the lower portion of the first opening and the second opening;

removing the second dielectric layer from the first opening and the second opening; and filling the first opening and the second opening with a conductive material.

* * * * *